United States Patent
Shimase et al.

[11] Patent Number: 5,952,658
[45] Date of Patent: Sep. 14, 1999

[54] METHOD AND SYSTEM FOR JUDGING MILLING END POINT FOR USE IN CHARGED PARTICLE BEAM MILLING SYSTEM

[75] Inventors: Akira Shimase, Yokosuka; Yuichi Hamamura, Yokohama; Junzou Azuma, Ebina; Michinobu Mizumura, Yokohama, all of Japan

[73] Assignee: Hitachi, Ltd., Tokyo, Japan

[21] Appl. No.: 08/844,433

[22] Filed: Apr. 18, 1997

[30] Foreign Application Priority Data

Apr. 18, 1996 [JP] Japan .................................. 8-096531

[51] Int. Cl.⁶ .................................................. H01J 37/304
[52] U.S. Cl. ...................................... 250/309; 250/492.21
[58] Field of Search .................................. 250/309, 397, 250/492.21

[56] References Cited

U.S. PATENT DOCUMENTS

| | | | |
|---|---|---|---|
| 4,457,803 | 7/1984 | Takigawa et al. | 250/492.21 |
| 4,503,329 | 3/1985 | Yamaguchi et al. | 250/492.21 |
| 4,661,702 | 4/1987 | Welkie | 250/309 |
| 4,683,378 | 7/1987 | Shimase et al. | 250/492.21 |
| 5,140,164 | 8/1992 | Talbot et al. | 250/309 |
| 5,429,730 | 7/1995 | Nakamura et al. | 204/192.34 |
| 5,504,340 | 4/1996 | Mizumura et al. | 250/423 R |
| 5,541,411 | 7/1996 | Lindquist et al. | 250/309 |
| 5,639,699 | 6/1997 | Nakamura et al. | 437/238 |

FOREIGN PATENT DOCUMENTS

| | | |
|---|---|---|
| A-58-202038 | of 0000 | Japan . |
| A-6-96712 | of 0000 | Japan . |
| A-63-164219 | of 0000 | Japan . |
| B2-3-28017 | of 0000 | Japan . |
| B2-5-14416 | of 0000 | Japan . |

OTHER PUBLICATIONS

J.Vac. Sci. Technol. B6(6), Nov./Dec. 1988, pp. 2100–2103.

*Primary Examiner*—Bruce Anderson
*Attorney, Agent, or Firm*—Antonelli, Terry, Stout & Kraus, LLP

[57] ABSTRACT

A charged particle beam milling system which is designed in such a way that a milling end point is judged to stop the milling on the basis of a change in the magnitude of secondary ion signals generated when milling an electronic device such as an LSI having a multi-wiring layer structure, in which a wiring layer and an insulating layer are laminated, using a charged particle beam.

35 Claims, 14 Drawing Sheets

(1) UPPER LAYER IS EXPOSED $SiO_2$
W
Al
W
$SiO_2$ (2) Al IS EXPOSED (3) LOWER LAYER IS EXPOSED (4) $SiO_2$ IS EXPOSED (5) $SiO_2$ EXPOSED AREA IS INCREASED (6) IRREGURALITY IN $SiO_2$ IS MAXIMUM (7) IRREGURALITY IN $SiO_2$ IS DECREASED (8) IRREGURALITY IN $SiO_2$ IS CANCELLED

2 μm □

METHOD AND SYSTEM FOR JUDGING MILLING END POINT FOR USE IN CHARGED PARTICLE BEAM MILLING SYSTEM

BACKGROUND OF THE INVENTION

The present invention relates in general to a method and a system for judging a milling end point in a charged particle beam milling system for focusing charged particles such as an ion beam or an electron beam to form or mill a fine pattern on a predetermined substrate, and more particularly to a method and a system which are suitable for detecting a milling end point with high accuracy while monitoring secondary ions which are generated from a milled surface by applying charged particles in forming or milling a pattern in the process of manufacturing a semiconductor device such as an LSI or an electronic device such as a liquid crystal display panel which requires a fine pattern.

As for a charged particle beam milling system for focusing a charged particle beam such as an ion beam or an electron beam to irradiate a predetermined substrate with the charged particle beam, thereby forming or milling a fine pattern, the various kinds of methods and systems have been proposed. Now, as the typical example, the description will hereinbelow be given with respect to the case where an ion beam is focused in order to mill an LSI.

When applying the accelerated ion beam to an LSI, the constituent material of the LSI is removed from a surface of the LSI by sputtering. The technology of milling an LSI with an ion beam by controlling the sputtering has been conventionally well known.

In recent years, out of that technology, there is becoming general carrying out the logic modification of a logical LSI or the failure analysis of an LSI in such a way that by employing a focused ion beam using a high luminance ion source such as a liquid metal ion source of Ga or the like for example, the wiring of the LSI is cut, a window is formed through an insulating film overlying the wiring to expose the wiring, and the window is filled with metal by utilizing the CVD (Chemical Vapor Deposition) method to connect the wiring of interest to the different wiring. In this connection, the accuracy of the milling position and the milling depth becomes a problem in order to ensure the milling yield which is required in the respective applications.

The milling position is set with necessary accuracy by making free use of the technology wherein a stage on which an LSI is mounted is subjected to the length measurement to measure the accurate position and the mechanically positional deviation is corrected on the basis of the deflection of the ion beam, the technology wherein the charge-up of the surface of an LSI due to the positive electric charges of the ion beam is neutralized with the negative electric charges of the electrons by applying the electron shower thereto, or the like.

On the other hand, with respect to the milling depth, as described in JP-A-63-164219 for example, there is well known the technology wherein the sputtering rate of the constituent material of an LSI is previously measured and the accurate ion dose is measured during the actual milling process, thereby improving the depth accuracy.

In addition, when applying the ions to the material to be milled, the secondary particles are emitted from the surface to which the ions are applied. The secondary particles contain light, the secondary electrons and the secondary ions and also have the different yields depending on the difference between the construction materials of the layers constituting an LSI. Therefore, there is also well known the technology wherein the secondary particles are detected in order to monitor the progress of the milling, and at a time point when recognizing the predetermined signal change, the milling is stopped, thereby ensuring the milling depth accuracy. Those technologies are described in JP-B-3-28017, JP-A-58-202038, JP-B2-5-14416, JP-A-6-96712 and an article of Journal of Vacuum Science and Technology B6(6), November/December 1988, pp. 2100 to 2103 for example.

During the formation of a pattern, the accurate measurement of the ion dose as the technology for stopping the milling at a predetermined depth is, when milling a single construction material, the powerful control means in which that technology is all we can adopt. In the case where the object of milling is an LSI for example, however, the surface has irregularity which reflects the presence of the underlying wiring. Since if that irregularity is included in a milling area, the sputtering rate increase depending on the incident angle of the ions, even if the ion dose is accurately measured, the milling depth deviates from the depth in the case where the flat area is milled. In addition, in the case as well where several layers are milled during the milling process, the deviation occurs.

In addition, in the case of an LSI or the like in which a wide wiring for power supply is distributed on the most upper layer, after having milled up the wiring for power supply, the wiring underlying the wiring for power supply needs to be milled. In this case, though the wiring layer is normally made of metal such as aluminium, this metal is polycrystalline. In this connection, since the sputtering rate is changed depending on the crystal orientation, when milling the wiring layer, the milling speed varies and hence it is difficult to decide the milling speed at this time. Therefore, while the accurate measurement of the ion dose is effective in the case of the flat and single milling object, with respect to the object having a complicated structure in which the wiring layer and the insulating layer are laminated into a plurality of layers as in an LSI, that accurate measurement becomes no more than the auxiliary means of the milling depth control. Thus, in order to mill the construction material to an accurate depth, it is necessary to recognize directly the milling state of the layer, which is being milled, at the milling time point.

The information of the layer which is being milled is contained in the secondary particles which are generated by the ion irradiation. The method of detecting light as the secondary particle is already put into practical use by some people, and is described in the above-mentioned article of Journal of Vacuum Science and Technology B6(6), November/December 1988, pp. 2100 to 2103.

Now, by the light is meant the light excited ion impact. This light excited ion impact is obtained in such a way that the atoms of the construction material of an LSI which are obtained by the sputtering are partially excited, and when such atoms are returned back to the ground state in the vicinity of the position where such atoms are emitted through the milled hole, such atoms emit the light having the wavelength inherent in the material of interest. However, in the case where both scale down (shrink) and the multi layer metallization are promoted as in LSIs of the recent years, the light emitted through the fine milled hole having a high aspect ratio is low in yield, and hence is difficult to be adopted for the practical judgement of the milling end point.

Furthermore, though the secondary electrons can be detected by an MCP (Micro Channel Plate) as a secondary particle detector, or a combination of a scintillator and a photomultiple tube which are generally mounted to the focused ion beam milling system, a photo detector needs to be additionally mounted thereto in order to detect the light. In actual, with respect to that mounting, when aiming at efficient collection of light, mounting that detector in a space defined by the distance between a lower end of a lens in the final stage of an ion optical system and a upper face of a stage as the beam focusing point which should come close to each other as much as possible in order to enhance the beam focusingness results in difficulty in the machine design as well as a sacrifice or limitation of the function of other assembly (e.g., the electron shower and the gas nozzle). Therefore, it is difficult to find out the merit with respect to the light detection and hence the light detection can not be adopted as the practical milling end point detecting means.

In the case where the surface is covered with an insulating layer made of silicon dioxide ($SiO_2$) as in an LSI or the like, the positive electric charges are accumulated in the area which has been irradiated with the ion beam, and as a result, the so-called charge-up occurs. When the charged-up area is further irradiated with the ion beam, the positive electric charges of the ions and the positive electric charges on the charged-up surface repel each other so that the orbit of the ion beam is deflected and hence the position deviated from the milling position which is previously set will be milled. This problem is deadly to the milling and hence can not be admitted even when the application requiring the success yield is not of interest.

In addition, while there is the possibility that the voltage of the charge-up is increased up to the acceleration voltage of the ions, in actual, at a time point when the voltage of the charge-up has exceeded the breakdown voltage of the charged-up insulating film in the most upper layer, the breakdown is caused so that the electric charges are discharged towards the underlying wiring layer. In this connection, the traces of the breakdown ranging from the LSI surface to the wiring layer are formed and may become the paths through which the current leaks in some cases. When the excessive breakdown is caused, the electric charges charged-up on the insulating layer are spark-discharged to the wiring layer, and the insulating film overlying the wiring layer is scattered due to the impact of the breakdown. These phenomena are deadly when the LSI of interest is processed in the next process in order to be analyzed.

Then, as described above, the electron shower is installed, the electrons which have been drawn therefrom are applied to the vicinity of the milling area, and the positive electric charges of the ions are neutralized with the negative electric charges of the electrons, thereby avoiding the deflection of the beam due to the charge-up. At this time, since the electrons drawn from the electron shower need to be applied to an LSI, the electric field is directed to the direction of leading the electrons to the LSI side. In other words, when such an electric field is set, even if the secondary electrons which have been emitted by the ion beam irradiation go out from the LSI once, these secondary electrons are readily forced back to the LSI side. For this reason, when the neutralization of the electric charges is being carried out by the electron shower, it is impossible to detect any secondary electron. Therefore, while for an object of milling the surface of which is made of a conductor, it is possible to detect the secondary electrons to judge the milling end point, in the case where the coating of a conductor can not be applied to the surface of the normal LSI, the secondary electron can not be adopted as the means for judging the milling end point.

The secondary electrons have the yield which is the same order as that of the primary ion beam, whereas the yield of the secondary ions is in the range of 1 to 10% of that yield and hence is not high. However, the yield of the secondary electrons is higher than that of the light. In addition, even in the state in which the electron shower is applied to an LSI, the secondary electrons can be detected and hence the secondary electrons are the only practical detected particles in the detection of the milling end point in the LSI milling. In actual, the above-mentioned patent official gazettes (i.e., JP-B-3-28017, JP-A-58-202038, JP-B-5-14416 and JP-A-6-96712) describe that the secondary ions are made the means for detecting the milling end point.

However, in JP-B-3-28017, there is no concrete description with respect to the means for detecting the secondary ions. In JP-A-58-202038 and JP-B-5-14416, there is constructed the system provided with a mass analyzer as the secondary ion detector. In addition, while in JP-A-6-96712, there is described the method of carrying out both the element analysis and the structure analysis on the basis of the detection of the secondary ions, there is no practical description with respect to the detection of the milling end point in the milling of an LSI. That is, in the conventional milling end point detecting method of detecting the secondary ions, there is only disclosed the method of detecting the change during the milling in the ion detection amount of construction material forming the lamination layer, and hence there is not disclosed at all the method of solving the following three problems associated with the detection of the milling end point in the milling of an LSI by the actual focused ion beam.

(1) With respect to the structure of the wiring layer and the insulating layer of an LSI, not only a conductor such as aluminium is simply combined with a silicon dioxide, but also the various structures have been put into the practical use from the aspect of the device performance. In particular, in recent years, for the purpose of avoiding the electronmigration, there has been frequently adopted the method wherein the wiring layer made of aluminium is sandwiched between the layers each made of different material such as tungsten. However, there is not established yet the method of detecting the milling end point for a new wiring layer as having such a multilayer structure.

(2) In the milling of an LSI, the amount of materials to be milled is increased and hence the burden is increased which is imposed on an operator of a system for judging the milling end point while observing the secondary ions closely to stop the milling. In particular, while with respect to the process, such as a modification of the wiring, in which the milling extends over a long time period, the milling error is apt to occur, since in the application thereof, one mistake makes the chip of interest a defective, the milling yield is decreased and also the acquisition ratio of the non-defective chips to the constructed chips is reduced. In addition, in the application or the like wherein since the change in the signal which is used to judge the milling end point varies for every operator, a window is formed by boring through the wiring and metal is deposited to the surface of the chip while filling the window by the CVD method or the like in order to draw the wiring therefrom, the difference in the connection resistance occurs between the wiring of the chip itself and the wiring which is newly formed by the deposition of metal, and hence the dispersion occurs in the signal transfer speed of an LSI. This also results in the chip being made a defective and hence should be avoided.

(3) In the case of the milling process in which increasing the milling throughput is indispensable thereto, the beam having a large ion beam current is used in the milling. In this case, if the milling end point is not judged speedily, the milling progresses over a schedule and hence the milling yield is reduced. For example, when the aluminium wiring is milled with the beam of 2 nA, if the milling size is 1 μm□, the progress of the milling depth for one second becomes approximately 1 μm. This corresponds to the milling depth corresponding to the thickness of the wiring layer, and hence if the over-milling for one second is carried out, then even granted that a window is opened through the wiring, in actual, the window is opened throughout the wiring to mill even the underlying layer. In actual, while the excessive progress of the milling is mitigated to some degree by optimizing both the beam current to be used and the milling size, there is a limit to this technique due to the request from the throughput, and hence the milling end point should be judged within a short time period.

Hereinabove, the problems associated with the prior art have been described with the example of milling an LSI by the focused ion beam as the charged particles becoming the milling beam as the center of discussion. In this connection, the pattern formation by the fine milling of this sort is also applied to the electron beams. In addition, an object of the milling is not limited to an LSI, and hence it is also applied to an electronic device such as a liquid crystal display panel of the active matrix formula in which for example, thin film transistors (TFTs) are formed on a glass substrate with high density. Either case corresponds to the important pattern forming technology and also is the problem which is generally common to the electronic devices each having the multi-wiring layer structure in which the wiring layers and the insulating layers are laminated.

SUMMARY OF THE INVENTION

In the light of the foregoing problems associated with the prior art, the present invention was made in order to solve the foregoing problems and an object of the present invention is, for use in a charged particle beam milling system for focusing a charged particle beam to form or mill a fine pattern on a predetermined substrate, to provide a method and a system which are capable of detecting a milling end point with high accuracy by improving the method of monitoring the secondary ions as the milling end point detecting signal.

Incidentally, the example of milling an LSI with the focused ion beam is difficult to be concretely understood, and therefore, in the following description as well, just as the foregoing, the description will hereinbelow be given with typical examples as examples of milling an LSI as the center of discussion.

In order to solve the above-mentioned problem (1), the wiring of an electronic device, such as a liquid crystal display panel or an LSI, having a multi-wiring layer structure is milled with a charged particle beam such as a focused ion beam, and during the milling process, the change in a secondary ion signal detected from the milling area is recorded and the waveform thereof is analyzed, whereby the change in the magnitude of the secondary ion signal in the wiring layer structure such as an LSI wiring. In addition, the change in the magnitude of the secondary ion signal varies depending on the milling methods. Therefore, these milling methods are actually applied to record the change in the magnitude of the secondary ion signals, the data which can be utilized for the judgement of the milling end point is previously, empirically stored, and the judgement of the milling end point is realized on the basis of the data thus stored.

In order to solve the above-mentioned problem (2), the algorithm for judging the milling end point is constructed on the basis of the analysis result of the magnitude of the resultant secondary ion signal. The algorithm is such that if the secondary ion signal has a peak in the wiring layer, then that peak is detected, while if the magnitude of the secondary ion signal has a bottom, then that bottom is detected. The correspondence between the peak or bottom and the interfaces of the wiring layers is previously grasped in the form of data and on the basis of the data, the milling down to the predetermined layer can be made possible.

In order to solve the above-mentioned problem (3), the secondary signal which varies every lapse of one second along with the progress of the milling is fetched in at short intervals in order to be processed. In addition, the signal thus processed is applied through the end point judging algorithm, and also the interval of the path for end point judgement is also made the time corresponding to the interval of fetching in a signal.

Now, the concrete means with which an object of the judgement of an end point of the present invention will hereinbelow be described as follows.

That is, a method according to the present invention is an end point judging method wherein a charged particle beam is focused to be applied to a predetermined area of a multi-wiring layer structure which is obtained by laminating an insulating layer and a wiring layer of an electronic device, and the structure is milled down to a level of a predetermined depth while detecting a milling end point, which method may provide that the wiring layer has a lamination structure including a layer made of a construction material which has a higher secondary ion yield than that of the insulating layer and a layer made of a construction material which has a lower secondary ion yield than that of the insulating layer, when detecting a milling end point while monitoring the intensity of the secondary ions which are emitted from an irradiated area by irradiation of the beam, the change in the magnitude of a secondary ion signal is recorded, and its waveform is analyzed to detect either a peak of the magnitude of the secondary ion signal in the layer made of a material having a high secondary ion yield or a bottom of the magnitude of the secondary ion signal in the layer made of a material having a low secondary ion yield, thereby judging the milling end point.

Now, an electron beam or an ion beam which is emitted from the liquid metal ion source such as Ga ions is employed as the charged particle beam, and as for the electronic device, the device, such as the liquid crystal display panel, having the multi-wiring layer structure into which an insulating layer and a wiring layer are laminated becomes an object.

As for typical metal for use in the layer made of a construction material having a higher secondary ion yield than that of the insulating layer, there may be given at least one kind of metal which is selected from the group consisting of tungsten, tungsten alloy, molybdenum, molybdenum alloy, titanium, titanium alloy, tantalum and tantalum alloy for example. On the other hand, as for typical metal for use in the layer made of a construction material having a lower secondary ion yield than that of the insulating layer, there may be given at least one kind of material which is selected from the group consisting of aluminium, aluminium alloy and polycrystalline silicon.

Then, preferably, when detecting the milling end point while monitoring the intensity of the secondary ions which are emitted from the irradiated area by the irradiation of the above-mentioned beam, it is desirable to adopt any one of the following methods.

That is, the secondary ion signals are accumulated every scanning area to be milled, and the direction of the change in the magnitude of the secondary ion signal is monitored, thereby judging the milling end point. After having accumulated the secondary ion signals within the scanning area to be milled, these signals are equalized, and the direction of the change is monitored, thereby judging the milling end point. After having accumulated the secondary ion signals within the scanning area to be milled, these signals are equalized, and the resultant secondary ion signal which is obtained by equalization is differentiated to monitor the direction of the change.

In addition, after having accumulated the secondary ion signals within the scanning area to be milled, these signals are equalized, the secondary ion signal which is obtained by equalization is differentiated, and the peak of the secondary ion signals is detected on the basis of the changes in a sign of the differential signal, thereby judging the milling end point. The judgement of the milling end point is not started from the beginning, but the setable end point judgement start dose is provided. A setable threshold level for the secondary ion signal is provided, and it is judged that the threshold level is exceeded, thereby judging the milling end point.

Furthermore, a setable threshold level for the differential signal of the secondary ion signal is provided, and it is judged that the threshold level is exceeded, thereby judging the milling end point. A sampling area for the secondary ion signal which is smaller than an irradiated area for the beam is provided, either a peak of the magnitude of the secondary ion signal in the layer made of a construction material having a high secondary ion yield or a bottom of the magnitude of the secondary ion signal in the layer made of a construction material having a low secondary ion yield is detected and also a peak of the intensity of the secondary ions emitted from the irregularity which is formed on the milled bottom face after completion of the milling of the wiring is detected, whereby the milling end point is more accurately judged.

In addition, in order to attain the above-mentioned object, according to the present invention, there is provided a milling end point judging system for use in a charged particle beam milling system for drawing a charged particle beam from a charged particle source, and focusing, deflecting and applying the charged particle beam onto a sample to be milled by lenses and deflecting electrodes to form a predetermined pattern on the sample, which a milling end point judging system may provide that the secondary particles which are emitted from an area of an object of milling in the sample by irradiation of the charged particle beam are detected by a secondary particle detector, a signal representing the magnitude of the secondary particle signal which is obtained by amplifying the detected signal is divided, one of the signals which are obtained by the division is inputted to a module for milling end point judgement different from a controller of the charged particle beam milling system, and the milling end point is judged in the module for milling end point judgement independently of the controller of the charged particle beam milling system.

The above-mentioned charged particle source is constructed by either an electron source employing an electron gun or an ion source comprised of a liquid metal ion source such as Ga ions. In the case of the electron source, the system of interest is an electron beam milling system, while in the case of the ion source, the system of interest is a focused ion beam milling system.

In addition, in the case where the secondary particles emitted from the area of an object of milling in the sample is the secondary electrons, the above-mentioned secondary particle detector is comprised of a secondary electron detector, while in the case of the secondary ions, the above-mentioned secondary particle detector is comprised of a secondary ion detector.

Preferably, the system is designed in such a way that the above-mentioned inputted secondary particle signals are accumulated every beam irradiation spot in the scanning for one field of an irradiation beam, the accumulated data every field is latched by an accumulation circuit, and the data thus latched is read out at fixed time intervals to be inputted to a processing system. In addition, the above-mentioned module for milling end point judgement is constructed by the hardware. Other respects will be described concretely in the preferred embodiments of the present invention.

The description will hereinbelow be given with respect to an example of milling a wiring structure in the case where the wiring modification is required in the process of inspecting an LSI.

While an LSI is deeply milled step by step from the upper layer as the milling progresses, the layers such as an insulating layer and a wiring layer which are being milled have the different secondary ion yields, respectively. For example, it has been found that the secondary ion yield increases gradually as tungsten, silicon dioxide, silicon nitride and aluminium are milled in an LSI in this order. In addition, it is the conventionally well known fact that the interposition of oxygen influences upon the secondary ion yield. By taking the combination of the layers made of those materials into consideration, the data, relating to the changes in the magnitude of the secondary ion signal, which is previously, empirically obtained with respect to the case where a plurality of milling methods corresponding to the actual LSI are applied is stored in the form of database in a memory. The information stored in the form of database includes the dose which is required for starting the end point judgement operation after having started the milling, the setting of cutting a wiring layer /opening a window, the over dose which is required for progressing the milling after detection of a peak, the milling stop dose which is required for stopping forcedly the milling when no peak is detected, and so forth.

The type of changes in the magnitude of the secondary ion signal resulting from the progress of the wiring milling is grasped on the basis of the above-mentioned database, and the end point judging algorithm according thereto is described so as to be programmed to carry out the judgement of the end point in the milling. In this connection, since the inputted secondary ion signal contains therein the noises, after having subjected such a secondary ion signal to the equalization processing and the like, such a secondary ion signal may be subjected to the differential processing in order to judge a peak and a bottom of the signal in some cases.

Since in order to carry out the above-mentioned equalization processing and the like, a large number of secondary ion signal inputs which are detected every moment are used simultaneously to carry out the judgement of the milling end point, the judgement of the milling end point is delayed by the time period corresponding to the number of signals to be processed simultaneously. In order to prevent the excessive progress of the milling due to that fact, the time period which is required for fetching in the signals, the processing thereof and the judgement needs to be shortened. However, since the controller of the focused ion beam milling system itself monitors the voltage, the degree of vacuum and the like at all times, it is difficult to shorten the time period required for detection of the milling end point. Then, the dedicated end point detection unit is provided in addition to the controller of the focused ion beam milling system, and the above-mentioned work is carried out therein, whereby the above-mentioned time period can be shortened.

BRIEF DESCRIPTION OF THE DRAWINGS

The above and other objects as well as advantages of the present invention will become clear by the following description of the preferred embodiments of the present invention with reference to the accompanying drawings, wherein.

Figure 11:
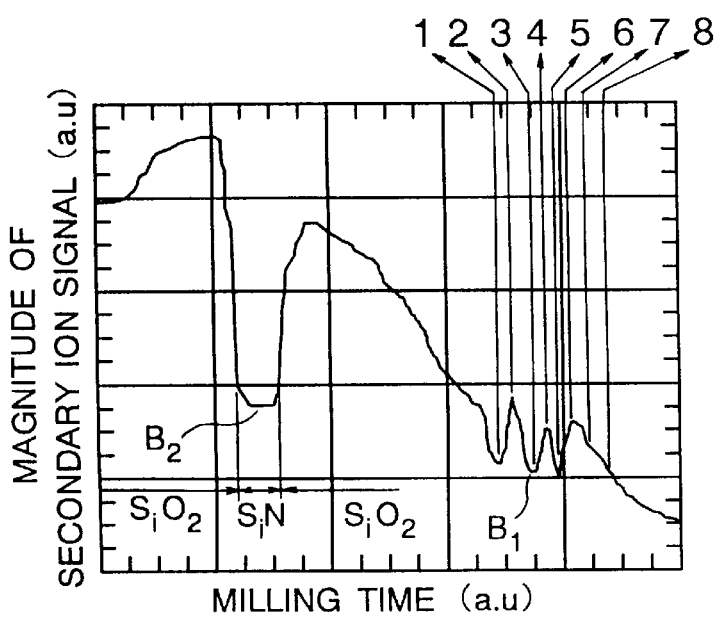
FIG. 11 is a graphical representation showing the change in the magnitude of a secondary ion signal when carrying out the milling shown in FIG. 9 and signal changing points.
Figure 12A:
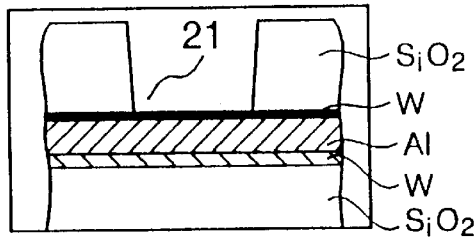
Figure 12B:
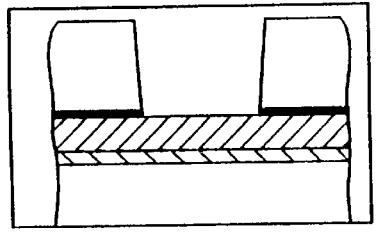
Figure 12C:
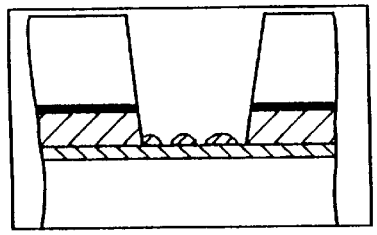
Figure 12D:
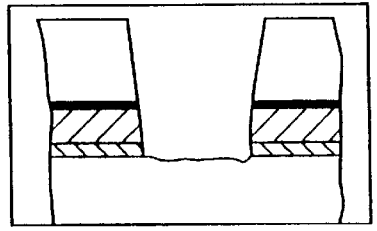
Figure 12E:
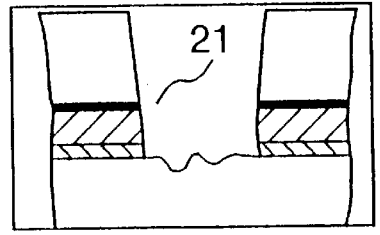
Figure 12F:
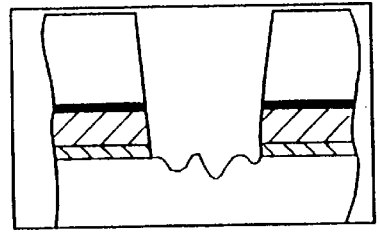
Figure 12G:
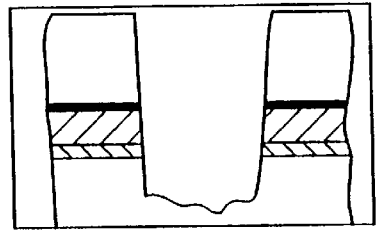
Figure 12H:
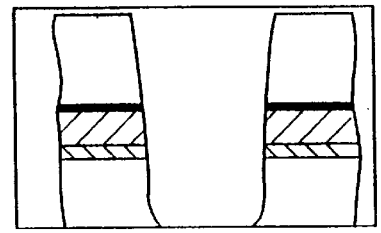
Figure 13:
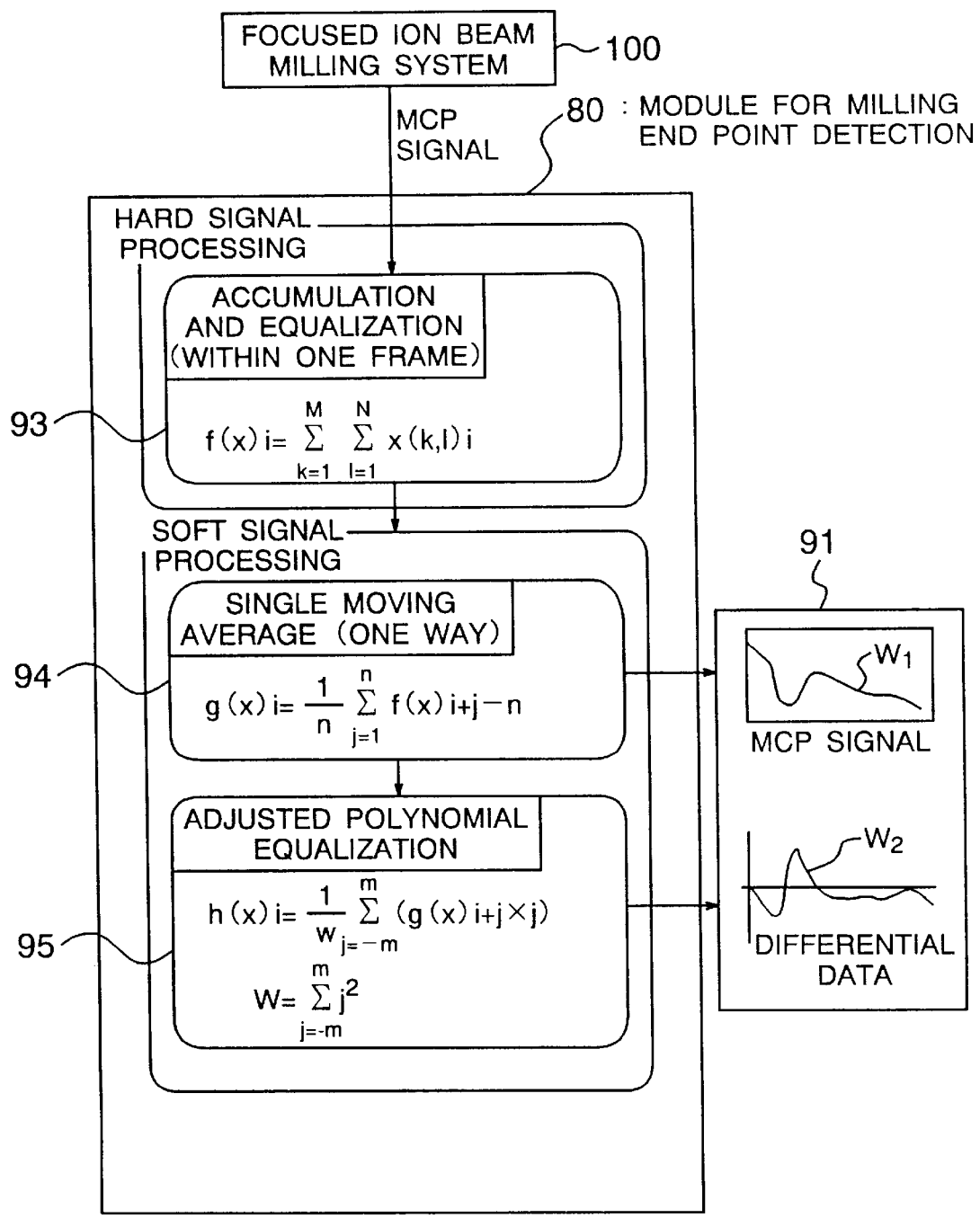
Figure 14:
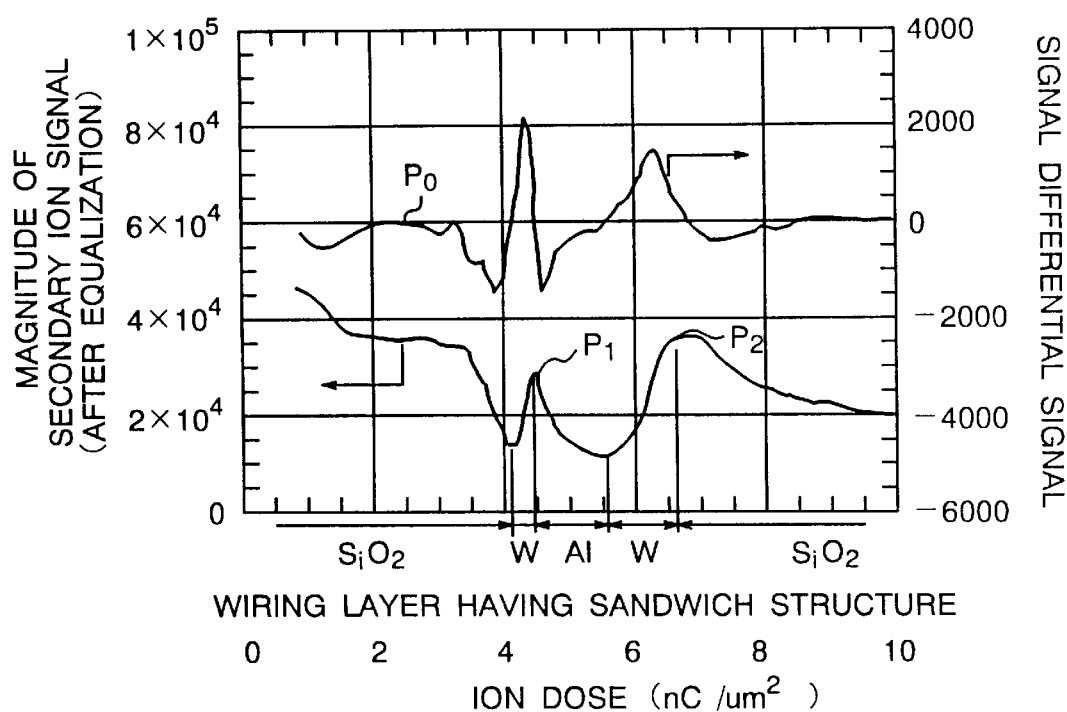
Figure 15:
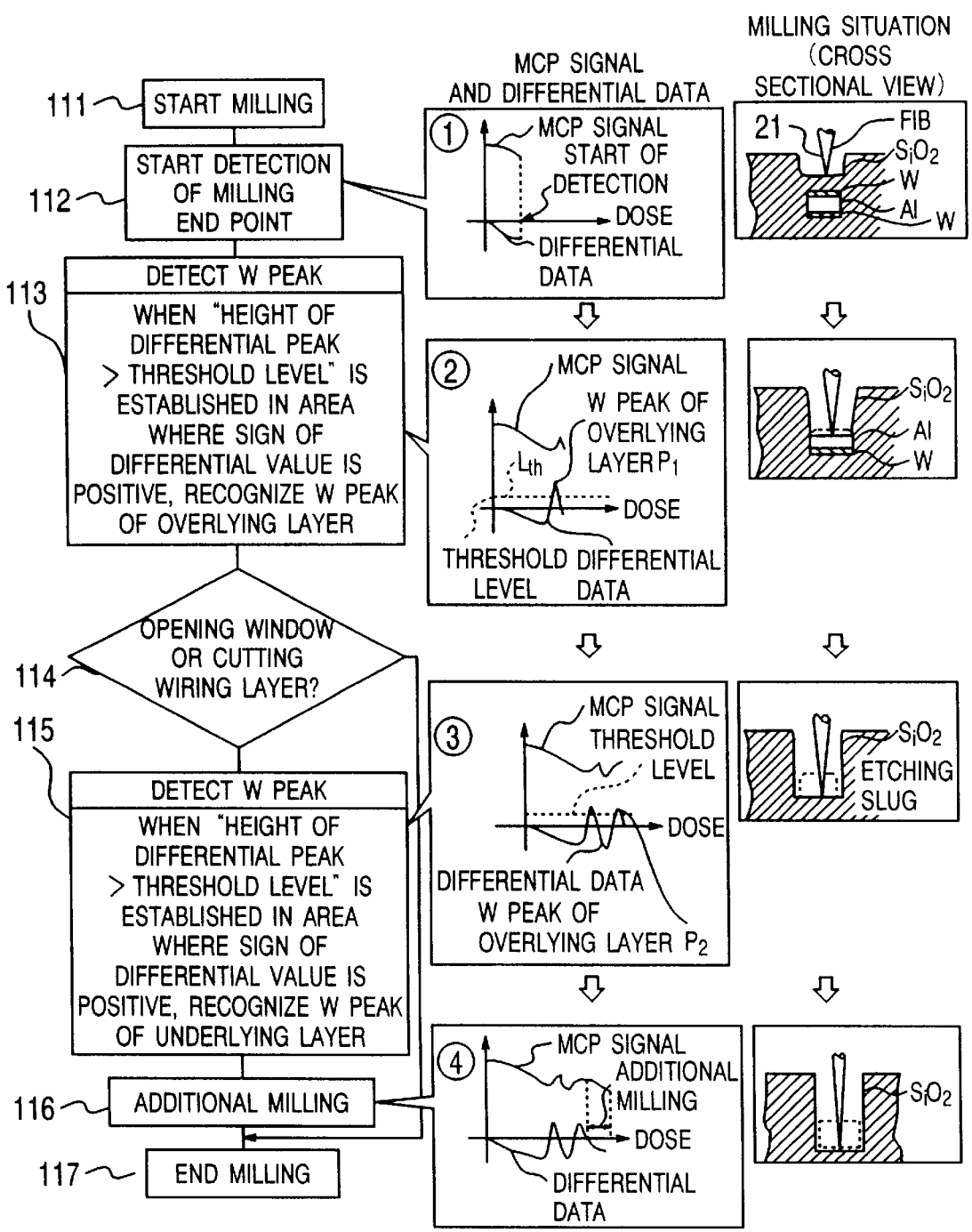
Figure 16:
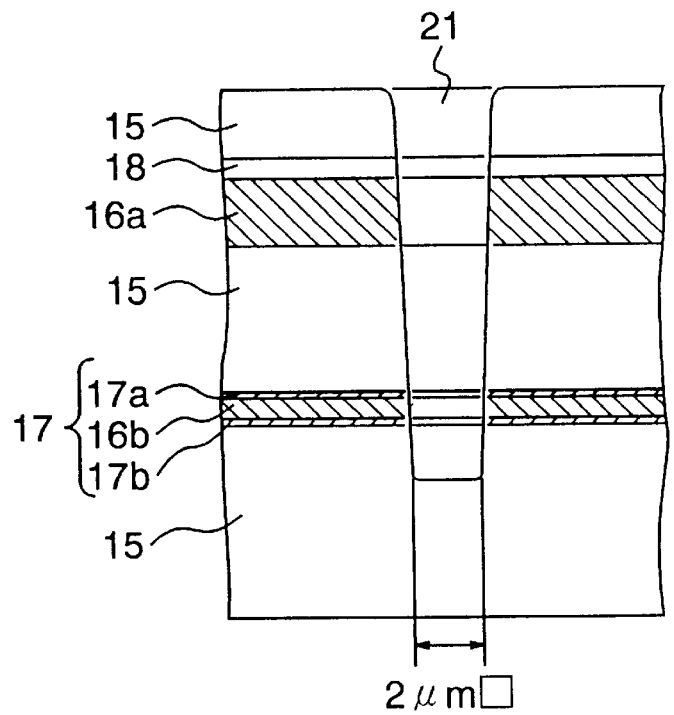
Figure 17:
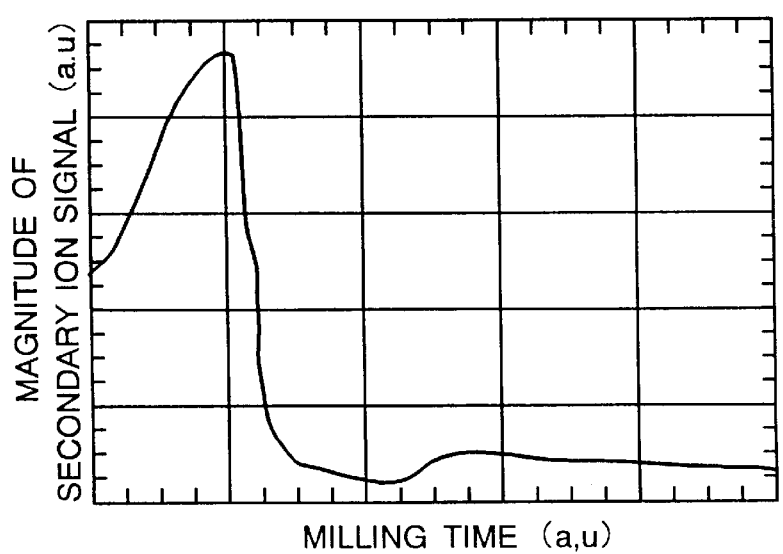
Figure 18:
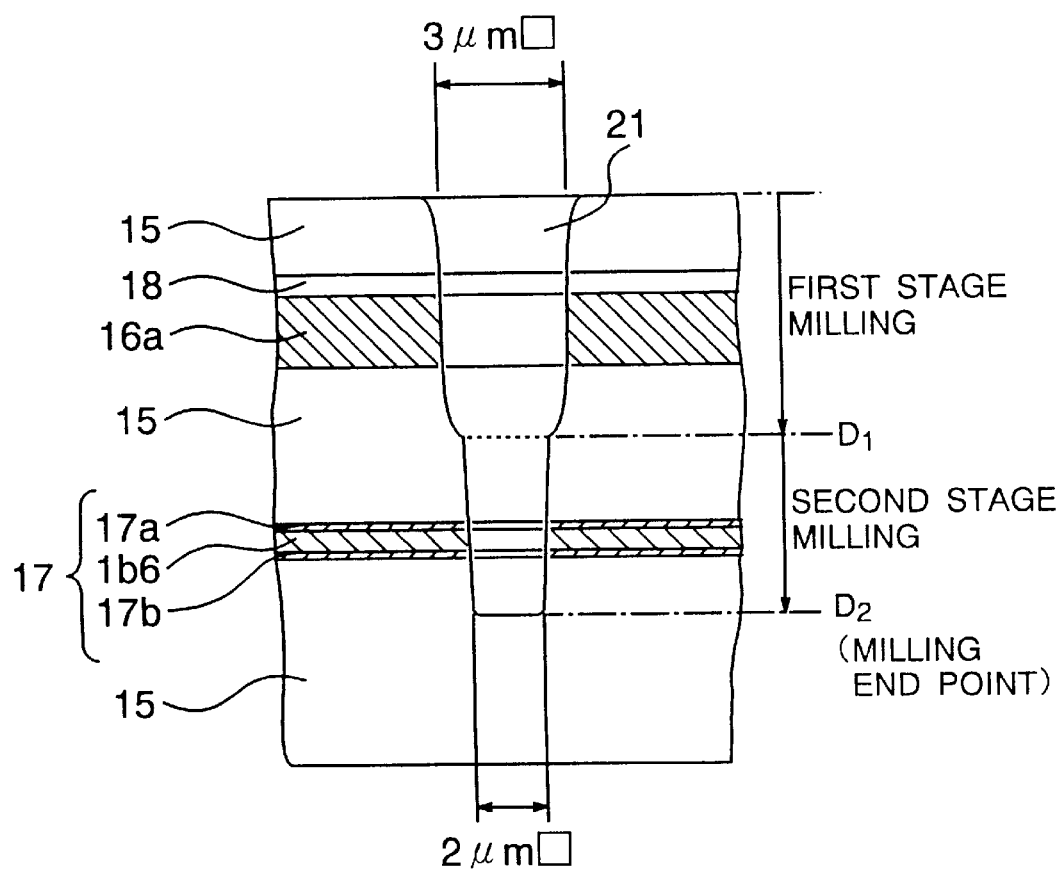
Figure 19:
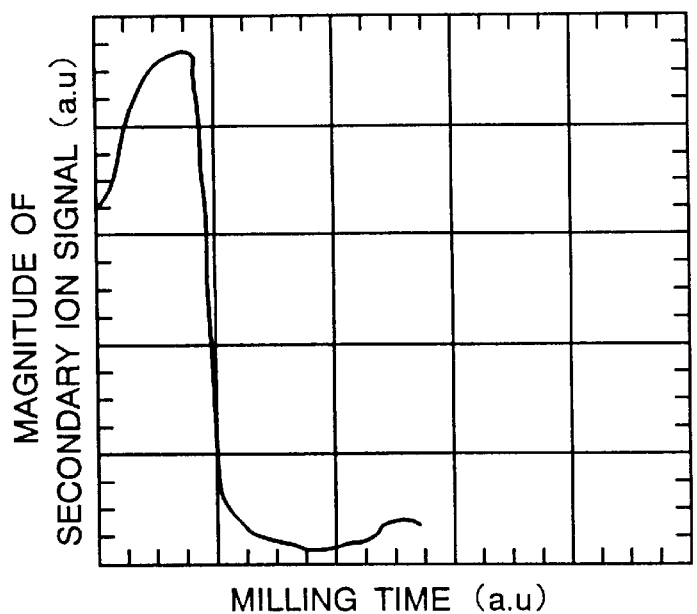
Figure 20:
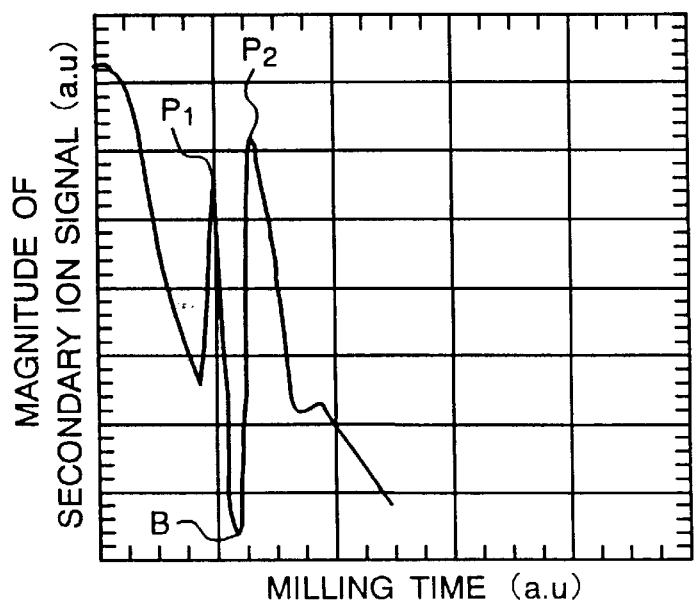

FIGA. 12(a)–12(h) are cross sectional views of an LSI showing the milling states corresponding to the signal changing points shown in FIG. 11;

FIG. 13 is a flow chart showing the signal processing which is executed in a module for milling end point detection;

FIG. 14 is a graphical representation showing the change in the magnitude of an MCP signal and a differential signal in the two-stages milling;

FIG. 15 is a flow chart showing an end point judging algorithm, a graphical representation of signals and cross sectional views of an LSI;

FIG. 16 is a cross sectional view of an LSI showing the situation in which the milling through an overlying aluminium wiring is carried out in one stage;

FIG. 17 is a graphical representation showing the change in the magnitude of a secondary ion signal when carrying out the milling shown in FIG. 16;

FIG. 18 is a cross sectional view of an LSI showing the situation in which the milling through an overlying aluminium wiring is carried out in two stages;

FIG. 19 is a graphical representation showing the change in the magnitude of a secondary ion signal when carrying out the first-stage milling shown in FIG. 18; and FIG. 20 is a graphical representation showing the change in the magnitude of a secondary ion signal when carrying out the second-stage milling shown in FIG. 18.

DESCRIPTION OF THE PREFERRED EMBODIMENTS

Figure 1:
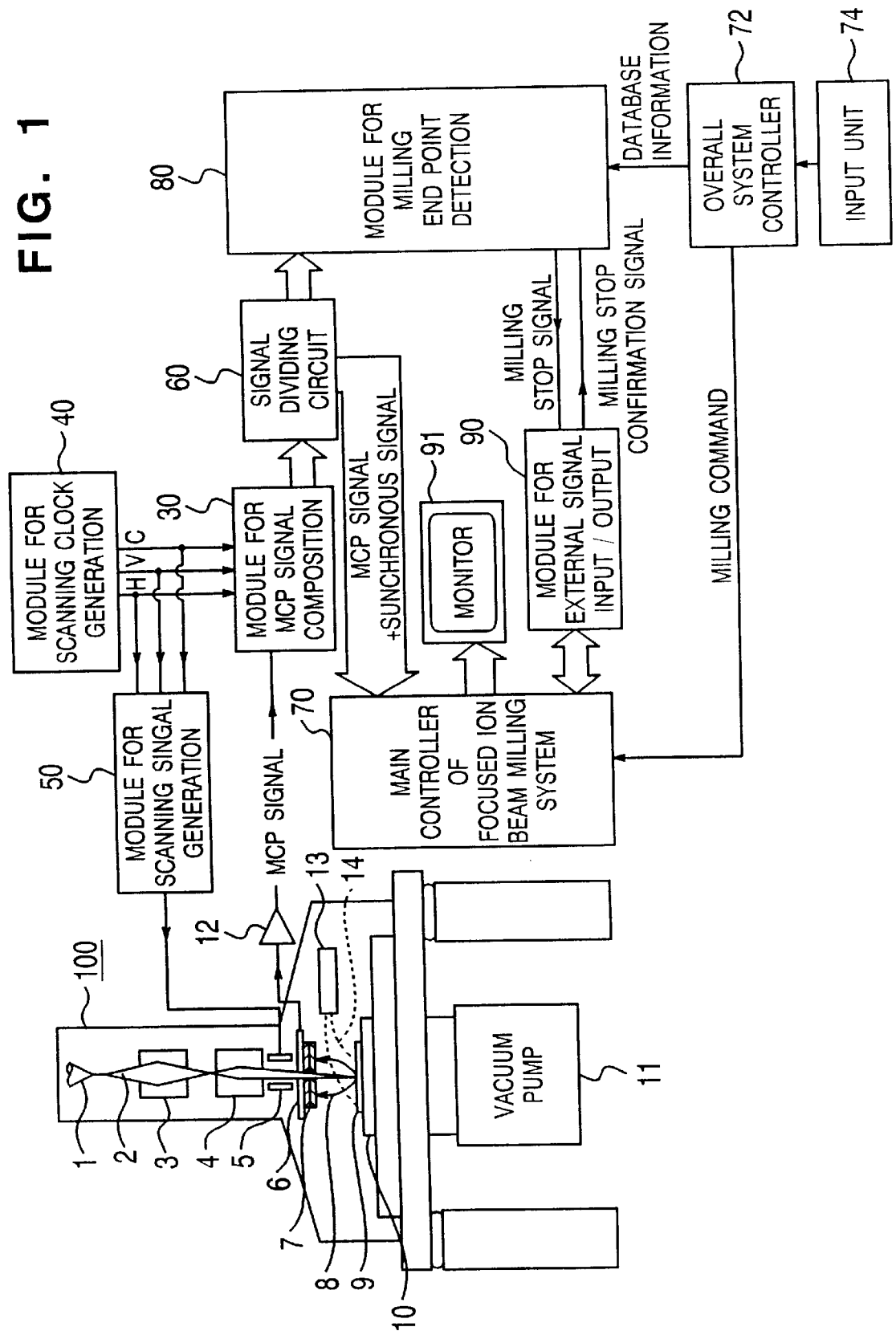
FIG. 1 is a cross sectional view, partly in a block diagram of modules, showing a construction of a focused ion beam milling system according to an embodiment of the present invention.

An embodiment of the present invention will hereinafter be described with reference to the accompanying drawings.
(1) Structural Example of System FIG. 1 is a block diagram showing schematically an embodiment of a focused ion beam milling system of the present invention. An ion beam 2 (e.g., a metallic ions such as Ga ions) which has been drawn from an ion source 1 is focused through a lens 3 and a lens 4 to be applied to an LSI 9 as a target which is placed on a stage 10, whereby the LSI 9 is milled and also a predetermined pattern is formed thereon. Secondary ions 8 out of secondary particles which have been generated at this time are detected by an MCP (Micro Channel Plate) 7 as a secondary particle detector.

Incidentally, since the surface of the LSI is generally covered with an insulating layer, the ion irradiation results in charge-up occurring. In order to prevent the charge-up, electrons 14 are supplied from an electron shower 13 to at least an area irradiated with ions at all times. In addition, the degree of vacuum in these units is kept normally on the order of about $10^{-7}$ Torr by a vacuum pump 11.

The secondary ion signal which has been amplified by the MCP 7 is detected by a detecting electrode 6, and then is further amplified by a head amplifier 12 which is installed in the vicinity of the system body. The resultant signal is inputted as an MCP signal to a module 30 for MCP signal composition. To the module 30 for MCP signal composition, a synchronous signal from a module 40 for scanning clock generation for controlling a module 50 for scanning signal generation from which a scanning signal is applied to deflecting electrodes 5 for the ion beam 2 is also inputted at the same time that the MCP signal is inputted. This synchronous signal consists of three signals, i.e., a horizontal synchronous signal H, a vertical synchronous signal V and a reference clock C corresponding to each scanning spot. By composing these signals, the MCP signal composing module 30 outputs both the MCP signal and the synchronous signal in the form of a digital signal.

Incidentally, in the normal system, these signals are supplied to a main controller 70 of the focused ion beam system which subjects these signals thus supplied thereto to a predetermined processing to form an image by a scanning ion microscope (SIM) for displaying an irregular image of the surface of an LSI on the basis of the same principle as that in a scanning electron microscope (SEM) so as to display the image thus formed on a monitor 91. In addition, at the same time, the processing for end point judgement is further applied thereto, and the information relating to the change in the magnitude of the secondary ion signal is also displayed on the monitor 91.

However, in this method, the main controller 70 for monitoring/controlling the overall focused ion beam milling system carries out the processings up to the judgement of the milling end point, and hence the frequency of monitoring the MCP signal for the judgement is forced to be decreased so that the milling progresses excessively for an interval between the judgement. This is an evil influence. If the ability of the main controller is excellent, then the interval between the judgement can be set to a small value, or it is possible to take the measures to stop the monitoring of the system while the milling is carried out, then the main controller can be burdened with all the processings up to the judgement of the milling end point. However, in the present circumstances, it is difficult to adopt such a procedure.

Then, in the present embodiment, the method is adopted wherein the signal outputted from the module 30 for MCP signal composition is inputted to a signal dividing circuit 60 which divides the same signal into two signals corresponding to the two routes, and one signal is supplied to the main controller 70 of the focused ion beam milling system while the other is supplied to a module 80 for milling end point detection so that the judgement of milling end point is carried out in the module 80 for milling end point detection independently of other processings, thereby shortening the interval between the judgement of the milling end point.

The module 80 for milling end point detection processes the MCP signal inputted thereto in a manner as will be described later in the chapter (2) to carry out the judgement of the milling end point. In this connection, if the level in milling is judged to be the milling end point, then a milling stop signal is transmitted to an external signal input/output module 90 as an input route towards the main controller 70 of the focused ion beam milling system in order to stop the milling operation.

In addition, the main controller 70 of the focused ion beam milling system transmits a milling stop confirmation signal to the module 80 for milling end point detection through the external signal input/output module 90 in order to cause the module 80 for milling end point detection to confirm that the milling has been stopped. Normally, the main controller 70 of the focused ion beam milling system carries out the judgement at intervals of one second according to this method even if the module 80 for milling end point detection carries out several processings and judgement, the judgement of the milling end point can be carried out at intervals of 0.1 second or less, and hence it is possible to prevent the milling from progressing excessively.

The overall system controller 72 supplies a milling command, which has been inputted through an input unit 74 in order to operate the focused ion beam milling system, to the main controller 70, and also supplies the data, relating to the change in the magnitude of the secondary ion signal, which is previously obtained empirically with respect to the various kinds of milling methods and which has been inputted through the input unit 74, to the module 80 for milling end point detection.

Figure 2:
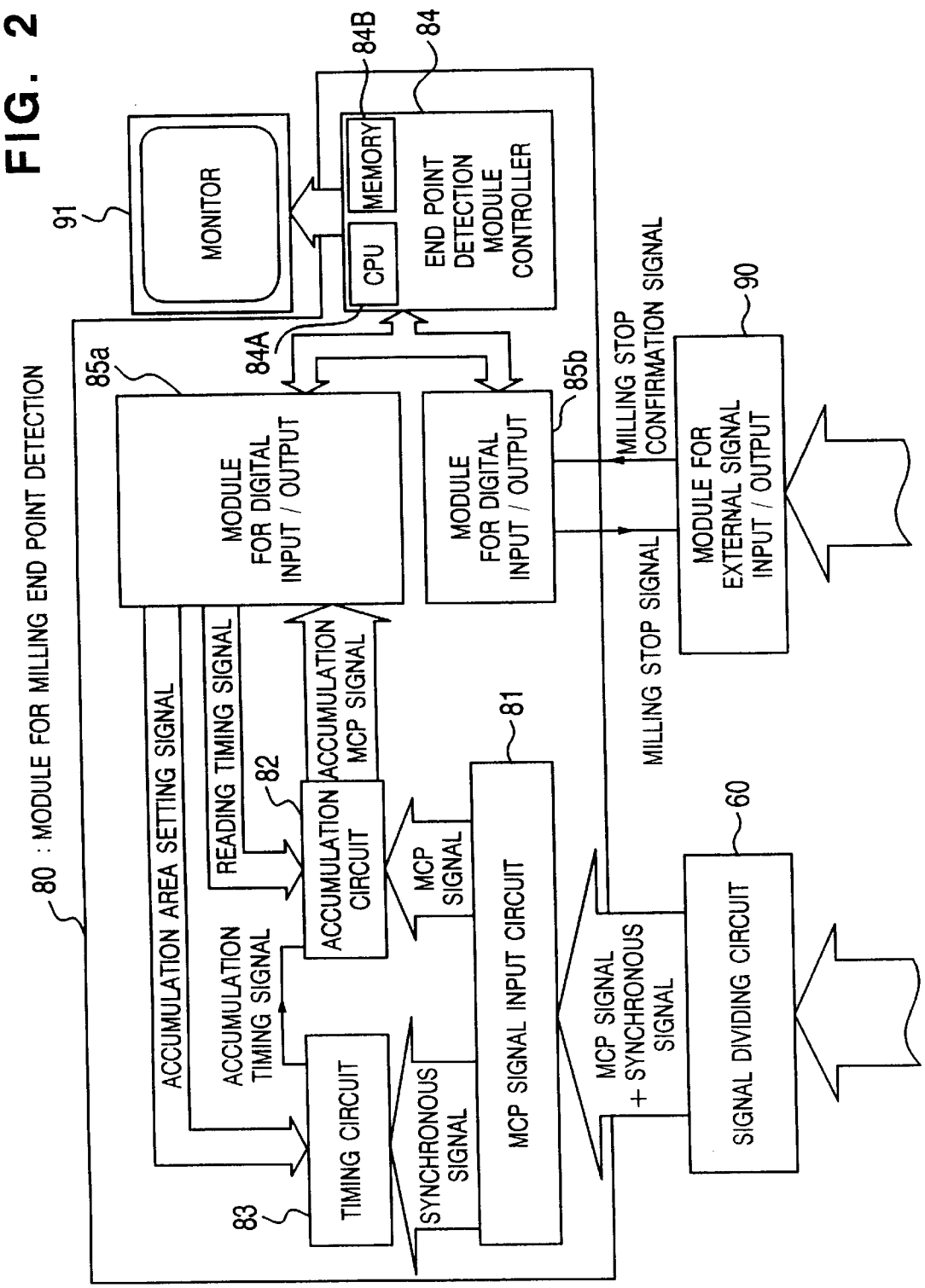
FIG. 2 is a block diagram showing a configuration of a module for milling end point detection.

The configuration of the module 80 for milling end point detection is as shown in FIG. 2. That is, the composite signal of the MCP signal and the synchronous signal which have been inputted from the signal dividing circuit 60 is divided into the MCP signal and the synchronous signal again in an MCP signal input circuit 81. Then, the MCP signal and the synchronous signal are supplied to an accumulation circuit 82 and a timing circuit 83, respectively. An accumulation area setting signal is inputted from a personal computer acting as an end point detection module controller 84 to the timing circuit 83 through a module 85a for digital input/ output. This offers the effect that in the one field scanning by the ion beam, the secondary ion signals from every scanning edge are removed, whereby the secondary ions from the side wall of the hole in milling are prevented from being detected and hence only the signal from each of the layers themselves out of the MCP signal can be obtained. While the method of setting an accumulation area will be described later, in accordance with the area thus set, the timing circuit 83 generates an accumulation timing signal in such a way that only the MCP signal relating to the secondary ions from spots within the set area when scanning one frame is accumulated in the accumulation circuit 82. Incidentally, the accumulation timing signal includes not only the specification of the MCP signal to be accumulated, but also the starting timing for accumulation and the timing of latching the accumulated value in the accumulation circuit 82 after completion of the accumulation. The timing of starting and ending the accumulation is determined on the basis of the vertical synchronous signal V.

In the accumulation circuit 82, the MCP signals are accumulated every field and are latched in the form of data in accordance with the accumulation timing. In the end point detection module controller 84, the data which is latched in the accumulation circuit 82 is read out at intervals according to its processing speed through the module 85a for digital input/output. Then, the data thus read out is subjected to the several processings in order to judge the milling end point. If the level of interest is judged to be the milling end point, then the milling stop signal is supplied to the main controller 70 of the focused ion beam milling system through the module 85a for digital input/output and the module 90 for external input/output to stop the milling. The milling stop confirmation signal is received in the manner as described above.

Incidentally, the method is adopted wherein the data latched in the accumulation circuit 82 is hard to be read out from the end point detection module controller 84 side, which results in the MCP signal being able to be inputted at fixed intervals. Therefore, even when the conditions of the system side in milling are changed, the program of the end point judgement side can execute a series of processings within a fixed time period at all times.

In addition, while in the present embodiment, the end point detection module controller 84 is constituted by the personal computer, the extended board and the circuit board, in order to execute the end point judgement algorithm described in the chapter (2), the personal computer does not need to be necessarily used, and hence all the structure may be constructed by only the hardware. In this case, the high speed end point judgement system can be carried out and also the high accurate end point judgement becomes possible.

(2) Example of Method of Judging Milling End Point

Figure 3:
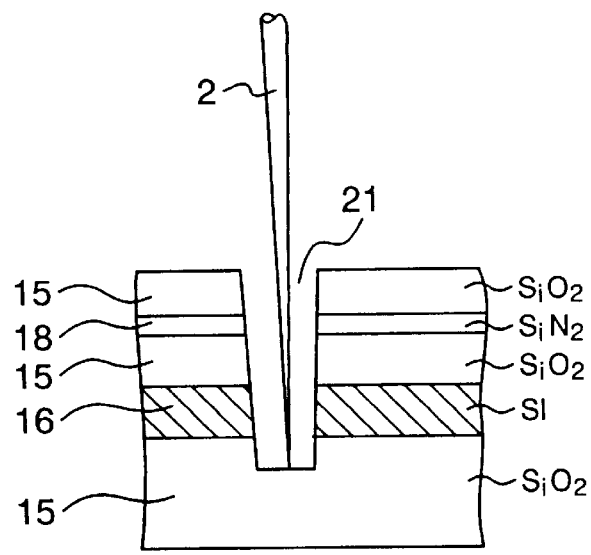
FIG. 3 is a cross sectional view showing a situation in which an aluminium wiring of an LSI is milled.

Next, the analysis of the MCP signal will hereinbelow be described in order to construct an end point judgement algorithm. Now, the description will be given with respect to an example of milling an LSI having the cross sectional structure as shown in FIG. 3. In FIG. 3, reference numeral 2 designates a focused ion beam (FIB), reference numeral 15 designates an insulating layer made of silicon dioxide, reference numeral 16 designates a wiring layer made of aluminium, reference numeral 18 designates an insulating layer made of silicon nitride, and reference numeral 21 designates a hole in milling. As shown in the figure, when the wiring layer 16 made of aluminium is formed so as to be sandwiched between the insulating layers 15 each made of silicon dioxide, as the LSI is milled using the FIB, as shown in the right-hand side of FIG. 4A, the magnitude of the secondary ion signal is reduced in the layer made of aluminium (a bottom in the variation of the magnitude of the secondary ion signal with time which is obtained in the layer made of aluminium is represented by B1). This reason is that the secondary ion yield of aluminium is lower than that of silicon dioxide. Incidentally, the axis of ordinate of FIG. 4A and the axis of abscissa thereof represent the magnitude of the secondary ion signal and the milling time (corresponding to the milling depth), respectively.

In this case, there is required the algorithm such that when the differential coefficient varies negatively, the state in which the differential coefficient further varies greatly, negatively (the bottom represented by B1) is obtained by detecting the negative peak when subjecting the magnitude of the MCP signal to the secondary differential, and the milling end point is judged on the basis of that negative peak.

Figure 4A:
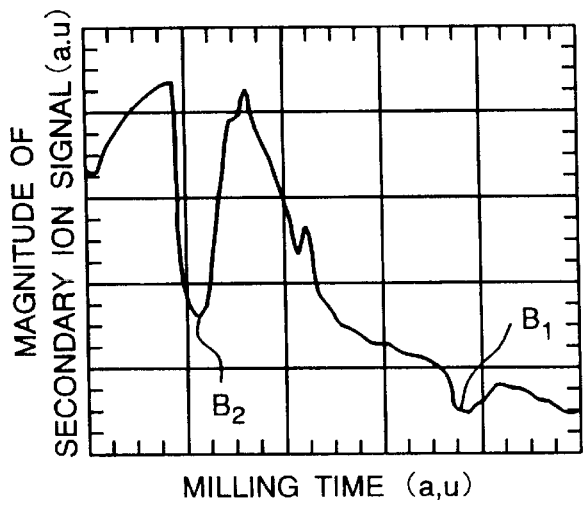
FIG. 4A is a graphical representation showing the change in the magnitude of a secondary ion signal when carrying out the milling shown in FIG. 3.
Figure 4B:
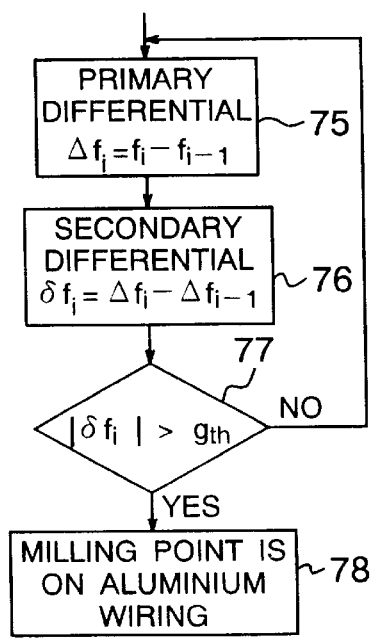
FIG. 4B is a flow chart of detecting an aluminium wiring layer when detecting the change in the magnitude of the secondary ion signal as shown in FIG. 4A.

FIG. 4B is a flow chart showing the operational procedure of a CPU 84A provided in the end point detection module controller 84 when subjecting the magnitude of the MCP signal to the secondary differential. In the figure, Step 75 is Step of calculating the primary differential. That is, in Step 75, a difference $\Delta fi$ between the magnitude fi of the MCP signal which is received every moment and the magnitude fi-1 of the MCP signal just before fi is obtained to be stored in the memory 84B. Next, in Step 76, the calculation of the secondary differential is carried out. By carrying out this calculation, a difference $\delta fi$ between the difference signal $\Delta fi$ and the difference signal $\Delta fi$-1 which is obtained just before $\Delta fi$ is obtained. In Step 77, it is judged whether or not the absolute value of the secondary differential value $\delta fi$ exceeds a predetermined threshold level gth. If $|\delta fi|$ is larger than gth, then the bottom B1 of FIG. 4A is judged to be obtained. Also, it is judged that the milling end point at this time is on the aluminium wiring.

However, since the differential itself has a low tolerance to the noises, and hence the differential value is largely varied due to even the small noises, carrying out the calculation up to the secondary differential results in the maljudgement being increased due to the noises, which is not practical. Therefore, in order to realize such a method, there is required the preprocessing for removing the noises. Incidentally, the falling portion (i.e., the bottom represented by B2) of the magnitude of the MCP signal which is shown in the left-hand side of FIG. 4 corresponds to the change in the magnitude of the MCP signal resulting from the fact that the secondary ion yield of the silicon nitride layer 18 is smaller than that of the silicon dioxide layer 15.

Figure 6:
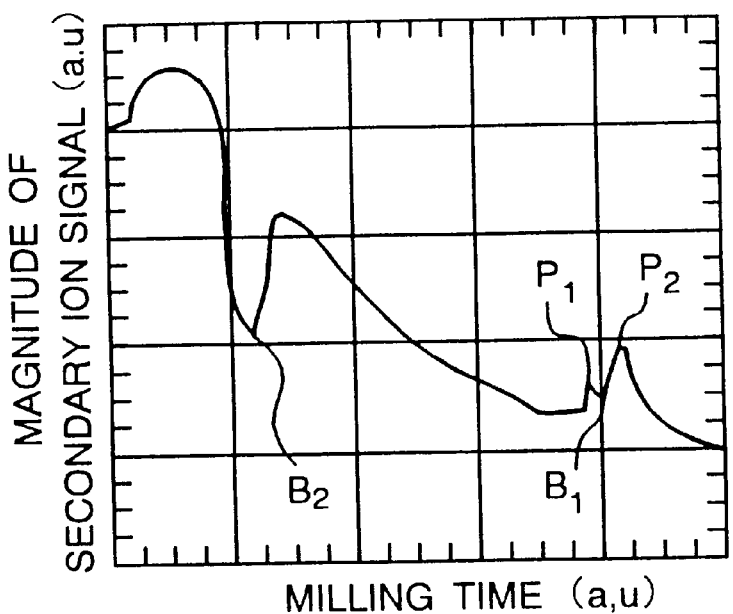
FIG. 6 is a graphical representation showing the change in the magnitude of a secondary ion signal when carrying out the milling shown in FIG. 5.

On the other hand, in the case of the aluminium wiring 16 which is sandwiched between tungsten layers 17a and 17b, since the secondary ion yield of tungsten is higher than that of the silicon dioxide layer 15, two peaks are obtained from the overlying tungsten layer 17a and the underlying tungsten layer 17b as shown in FIG. 6.

Figure 5:
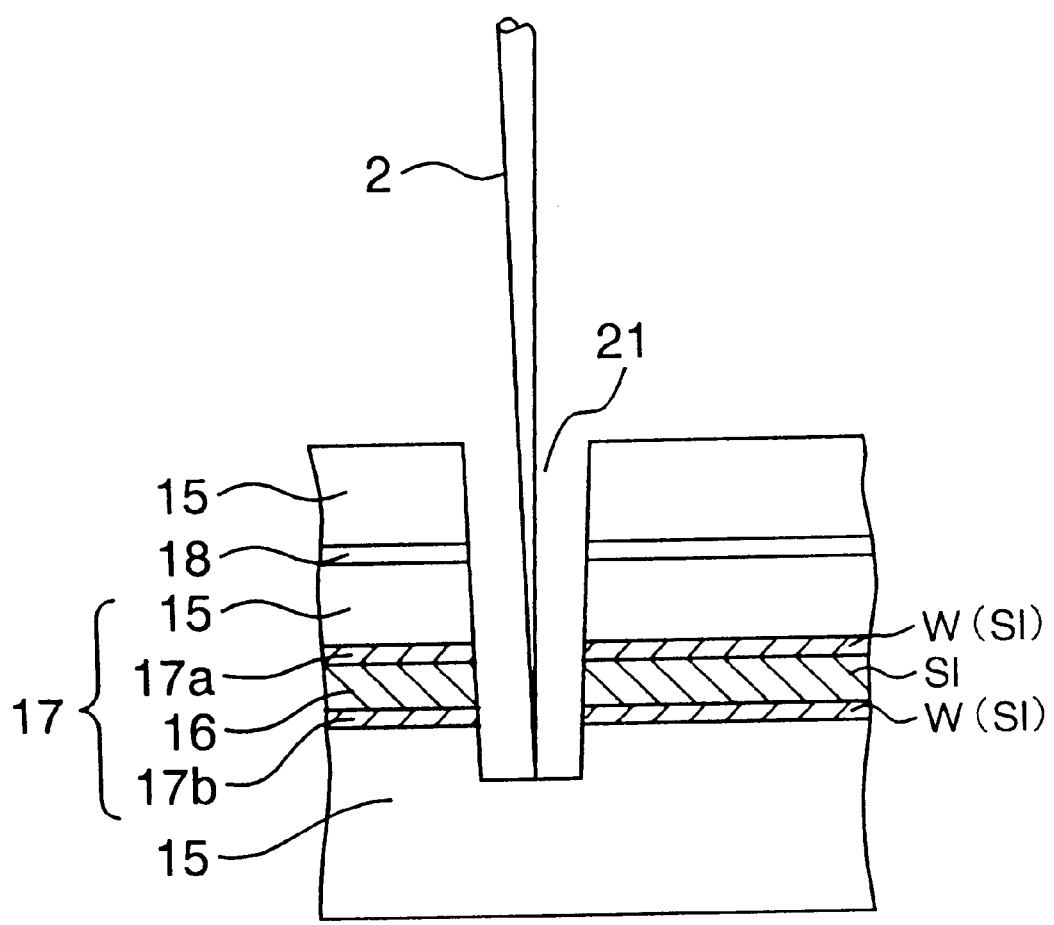
FIG. 5 is a cross sectional view showing the situation in which an aluminium wiring sandwiched between tungsten wirings in an LSI is being milled.

If the magnitude of the MCP signal is subjected to the primary differential, then the two peaks P1 and P2 in the change in the magnitude of the MCP signal can be readily detected, and hence the maljudgement due to the noises in the algorithm for judgement of the milling end point can be reduced. Then, preferably, in the mass production stage of an LSI, it is desirable that since in an LSI in at least the development stage, the frequency of various kinds of circuit modifications and failure analysis utilizing the focused ion beam is very high, as for the structure of the wiring layer, as shown in the example of FIG. 5, the overlying layer and the underlying layer each of which is made of a material (e.g., tungsten) having a higher secondary ion yield than that of an insulating layer are provided so as to sandwich therebetween the wiring layer (made of aluminium for example).

In addition, if a suitable material which has a lower secondary ion yield than that of the material of the wiring layer is sandwiched between the materials of the wiring layers, then the secondary ion signals from the upper and lower materials can be separated in analysis as two peaks from from those from other materials, and hence the judgement of the milling end point can be more readily carried out. Therefore, in manufacture of an LSI, providing the overlaying layer and the underlying layer, each of which is made of a material having a higher secondary ion yield than that of the wiring layer, so as to sandwich therebetween the wiring layer after due consideration with respect to the overall processes results in the judgement of the milling end point being readily carried out and hence is effective to the milling of an LSI, for the circuit modifications, the failure analysis and the like, utilizing the focused ion beam.

Incidentally, as long as all the wiring layers are made of a material having a higher secondary ion yield than that of silicon dioxide of which the interlayer insulating film is made, the judgement of the milling end point is more readily carried out as compared with the case where the wiring layers are made of a material having a low secondary ion yield. In the case where the wiring layer is formed of a single layer, selecting the LSI structure having the wiring layer which shows a higher secondary ion yield than that of the insulating layer is effective to enhancement of the efficiency of detecting a milling end point.

As shown in FIG. 2, while the method of limiting a signal sampling area in an area in milling using a timing circuit 83 is possible in the above-mentioned module 80 for milling end point detection, the effect thereof will hereinbelow be described.

Figure 7:
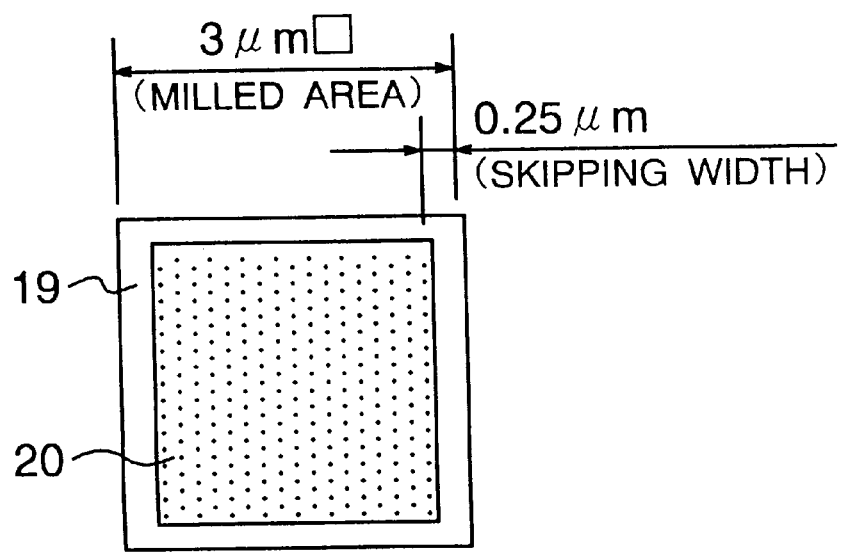
FIG. 7 is a plan view of a milling area showing a milling area and a signal sampling area.
Figure 8:
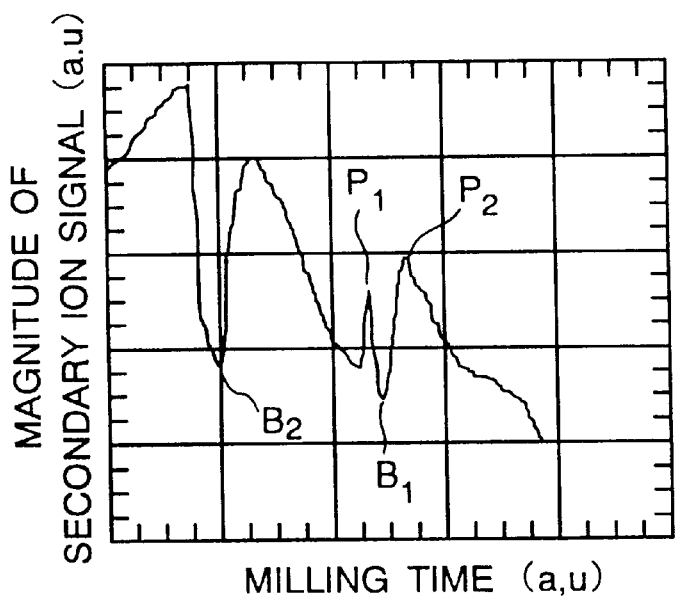
FIG. 8 is a graphical representation showing the change in the magnitude of a secondary ion signal when carrying out the milling shown in FIG. 7.

FIG. 7 is a plan view showing schematically an area which is irradiated with the focused ion beam, and also shows a normal milling example in which the wiring structure similar to FIG. 5 is milled. When the milling area is 3 $\mu m\square$ and a width of a peripheral portion, in which no signal is sampled, called a skipping width is 0.25 $\mu m$, the change in the MCP signal which is obtained therefrom is as shown in FIG. 8. In FIG. 8, similarly to FIG. 6, two peaks P1 and P2 each representing tungsten are detected. Such limitation in an area can be readily realized using the three synchronous signals H, V and C from the module 40 for scanning clock generation and also by utilizing the conventionally well known area specification technology.

Figure 9:
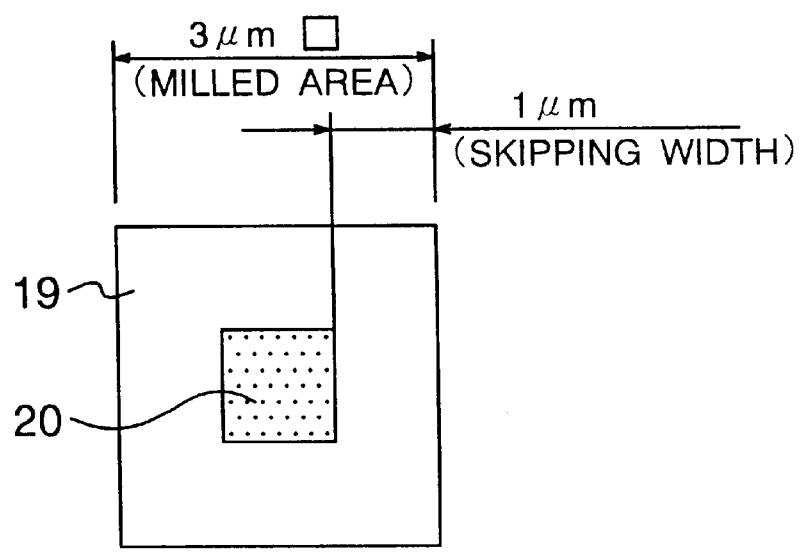
FIG. 9 is a plan view of a milling area showing a milling area and a signal sampling area.
Figure 10:
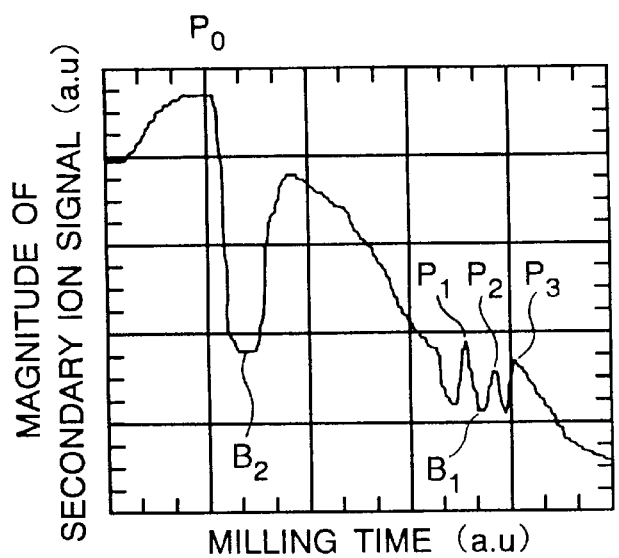
FIG. 10 is a graphical representation showing the change in the magnitude of a secondary ion signal when carrying out the milling shown in FIG. 9.

On the other hand, in the case of FIG. 9 in which the skipping width is further increased to be set to 1 $\mu m$ so that the influence of the side wall of the hole 21 in milling is excluded as much as possible, three peaks P1, P2 and P3 shown in FIG. 10 appear in the secondary ion signal. As the result of analyzing this phenomenon, it becomes clear that with respect to the individual MCP signal changing points (designated by reference numerals 1 to 8) shown in FIG. 11, as shown in FIGS. 12(a)–12(h) with the cross sections of the main portion in the milling stage being made correspond thereto, the first two peaks 2 and 4 correspond to the interfaces between the tungsten layers and the aluminium layer and hence correspond to the peaks P1 and P2 of FIG. 10, respectively. However, with respect to the last peak 6 (corresponding to the peak P3 of FIG. 10), the irregularity is generated in the milled bottom face during the milling of the wiring layer so that a part of the wiring layer which is speedily milled up and a part of the wiring layer which is slowly milled up are generated. In addition, since the milling speed for tungsten is slower than that for silicon dioxide and hence the milling for the insulating layer more speedily progresses in the part of the wiring layer which is speedily milled up, the irregularity of the milled bottom face of the insulating layer after completion of the milling of the wiring layer is further increased, the tendency in which the primary ion beam is applied to the inclined faces is increased, and hence the emission yield of the secondary ion particles is increased, whereby the last peak P3 appears.

Therefore, if the opening a window to a wiring layer or the cutting a wiring layer is of interest, then the milling end point can be sufficiently judged on the basis of the detection of the first two peaks. However, in the case where even the flatness of the milled bottom face becomes an issue, the signal sampling area is made sufficiently small with respect to the area to be milled, and the level corresponding to a time point after passing the peak P3 of the magnitude of the secondary ion signal and also the point 8 are detected, whereby it is possible to obtain the milled shape having a desired milled bottom face.

In such a way, the change in the magnitude of the secondary ion signal resulting from the progress of the milling is analyzed, whereby it is possible to construct the judgement algorithm for judging the milling end point. If the peak of the magnitude of the secondary ion signal with respect to tungsten can be clearly recognized as described above, then the milling end point can be readily judged. Therefore, in the present embodiment, the primary differential coefficient is used in the judgement of the milling end point. But, when detecting the secondary ions, the yield of the secondary ions is lower than that of the secondary electrons, and hence the MCP signal contains therein the noises. Therefore, the differential coefficient does not become the signal with which the milling end point can be judged unless the noises are removed to a fixed level.

Then, in the present embodiment, as shown in FIG. 13, the end point detection module controller 84 in the module 80 for milling end point detection carries out the necessary processing in order to remove the noises contained in the MCP signal. The MCP signal which has been inputted from the focused ion beam milling system 100 is accumulated hardwarely within one scanning frame in the accumulation circuit 82 in the module 80 for milling end point detection. As a result, the accumulation and equalization are carried out with respect to the number of ion beam irradiation points contained in the signal sampling area (Step 93).

Since in actual, the signal can not be equalized sufficiently by the above-mentioned processing alone, the MCP signal is, after having been accumulated, further equalized softwarely by the equalization processing. As a result, the calculation of the simple moving average is carried out in which the accumulated MCP signal at a certain time point is recorded in the form of data as the average value of the magnitudes of the MCP signals divided by several number which is set before the certain time point (Step 94). As for the equalizing method, while there is well known the adjusted polynomial equalization in which the equalization is carried out with a fixed weight, since this processing shows a tendency in which the noise having a fixed level or more is left as the change in the signal, in the present embodiment, the simple moving average is adopted. Another processing such as the adjusted polynomial equalization may be adopted depending on the situation of the MCP signal. The MCP signal which is equalized softwarely in such a way is displayed as the MCP signal having a waveform Wl as shown in FIG. 10 on the monitor 91.

Next, the differential processing is applied to the MCP signal. For this reason, the differential coefficient of the MCP signal is obtained through the processing method called the adjusted polynomial differentiating. This processing is not the simple differential processing, but the processing, including the equalizing processing, in which the equalization is further applied thereto (Step 95). The differential signal which is obtained by the processing as described above is also displayed in the form of a waveform W2 on the monitor 91, and also the judgement of the milling end point is carried out through the judgement algorithm.

Both the MCP signal and the differential signal after the actual equalization show the changes as shown in FIG. 14. In this figure, the axis of ordinate represents both the magnitude of the secondary ion signal and the signal differential signal, and the axis of abscissa represents the depth direction of the wiring layer as well as the ion dose. Now, while in the milling, the sample is employed which has the same wiring structure as that of the sample shown in FIG. 5, in this case, the milling is carried out in the two stages consisting of the first stage milling and the second stage milling as shown in FIG. 18. Since the signal waveform shown in the lower side in FIG. 14 corresponds to the second stage milling, the change (B2) in the magnitude of the signal due to the layer 18 made of silicon nitride in the first stage as shown in FIG. 6 does not appear therein.

Since in the signals shown in FIG. 14, the signals are not perfectly equalized yet, the fine vertical motion is shown in the differential signal shown in the upper side in FIG. 14. If the degree m of the simple moving average and the adjusted polynomial equalization is increased, then the signal itself can be further smoothed. In this case, the delay corresponding to the degree of interest occurs in the judgement of the milling end point, and also the peak itself of the signal becomes gentle, which is an obstacle to the judgement of the milling end point. Therefore, even when the noise remains therein, if the judgement of the milling end point is possible, then the signal waveform having such a degree as shown in FIG. 14, i.e., the signal waveform which is equalized up to the degree in which the detection of the peak of the waveform and the detection of plus and minus in the gradient of the waveform can be properly carried out will be used.

In addition, in the present example, the milling area is equal to or smaller than $2 \mu m\square$, and also in order to increase the milling throughput, the ion beam having a current of 1 nA or more is used. Therefore, it is impossible to make the signal sampling area smaller and hence only two peaks appear as the peaks in the magnitude of the MCP signal. However, since as described above, the two peaks P1 and P2 correspond to the overlying layer 17a and the underlying layer 17b each made of tungsten shown in FIG. 5, respectively, this makes the judgement of the milling end point possible. But, while the differential signal shows clearly the peaks in the layers each made of tungsten, the sign is inverted once at the point Po of FIG. 14 before showing the peaks each corresponding to tungsten, which may result in the maljudgement. In order to obtain the judgement algorithm in which that inversion is grasped as the change in the magnitude of the signal due to the noises and is not detected at all, a suitable threshold level is set so that only the peak exceeding that threshold level is detected.

Since it becomes clear that the magnitude of the signal is changed as shown in FIG. 14, the algorithm for judgement of the milling end point shown in FIG. 15 is constructed. When the milling is intended to be carried out in one stage from the surface to the objective wiring layer, as shown in FIG. 11, the large change in the magnitude of the signal appears in the silicon nitride layer 18 in the middle thereof (represented by the bottom B2). In addition, as shown in FIG. 18, even if the milling is carried out for the two stages and the signal is started to be detected after the change in the magnitude of the signal corresponding to the silicon nitride layer 18, just after starting the second stage milling, the magnitude of the secondary ion signal may be increased in some cases due to the influence of the end portion of the milled hole before the milled hole 21 is milled deeply.

In FIG. 15, when starting the milling in Step 111, the judgement of the milling end point is not carried out just after starting the milling, and the milling is made progress down to a fixed depth. Then, after the change in the magnitude of the signal is stabilized to some degree, the judgement is started (Step 112). Therefore, the end point judgement start dose is set in the algorithm stored in the memory 84B. While the detection of the milling end point is started at a time point when the ion dose progresses to the end point judgement start dose, the subsequent change in the magnitude of the signal as shown in FIGS. 14 and 15. Firstly, at a time point when the tungsten layer 17*a* is exposed, the magnitude of the MCP signal is increased and also the sign of the differential signal is changed from minus to plus, i.e., the sign is inverted (Step 113). While the overlying tungsten layer 17*a* is exposed at this time point, in actual, the center of the milled hole is merely exposed and hence it is insufficient as the window through which the wiring is connected. For this reason, a time point when the tungsten layer 17*a* has been milled up and then the first peak P1 in which the aluminium layer 16 begins to be exposed is started to be decreased is detected (Step 113). This time point is judged as the end point for opening the window (Step 114). This milling end point corresponds to the time point when after the sign of the differential signal has been inversed to plus once, it is inversed to minus, i.e., the sign of the differential signal is inverted again.

Now, the change in the magnitude of the MCP signal due to the noises is not judged to be the peak. Therefore, the differential signal side is provided with a threshold level Lth, and the peak of interest is not judged to be the peak corresponding to tungsten unless that peak exceeds the threshold level. In this case, the peak may also be judged on the basis of the condition that essentially, the change in the MCP signal side is provided with a threshold level, and the magnitude of the signal is inverted continuously from the lowest point thereof over a fixed time period. But, in the present embodiment, since it becomes clear that after having been subjected to the several equalization processings, each of the peaks due to the noises shows only the gentle change, while the peak corresponding to tungsten shows clearly the sharp change, the differential signal side is selectively provided with the threshold level.

In the case of the milling aiming at opening a window, the milling is completed at that time point and the process proceeds to the operation for stopping the milling (Step 117). On the other hand, in the case of the milling aiming at cutting a wiring layer, the milling is further carried forward in order to detect the next peak P2 corresponding to the tungsten layer 17*b*. In this case as well, similarly to the detection of the first peak P1, the time point when the sign of the differential signal is changed from minus to plus and then from plus to minus under the situation in which the height of the differential peak exceeds the threshold level is grasped, whereby it is judged that the underlying tungsten layer 17*b* is being milled (Step 115). But, in the case of the milling aiming at cutting a wiring layer, in this state, tungsten still remains on the milled bottom face and hence the wiring layer is partially in succession. Therefore, a fixed over dose is set, the additional milling is carried out (Step 116), and the time point when the additional milling has been completed is judged to correspond to the end point of the milling for cutting a wiring layer, and then the process proceeds to the operation for stopping the milling (Step 117).

As described above, the operation for stopping the milling is carried out in such a way that the module 80 for milling end point detection transmits a milling stop signal to the main controller 70 of the focused ion beam milling system 100, and then receives a milling stop confirmation signal therefrom, thereby completing the milling for one point (refer to FIG. 1). Incidentally, in the process of the opening a window, the method wherein at the time point when detecting the first peak P1 corresponding to the overlying tungsten layer 17*a*, the milling is not stopped and then a fixed over dose is applied, or at the time point when detecting the underlying tungsten layer 17*b*, the milling is stopped, whereby the connection area in the wiring connection process as the next process is increased and also the connection resistance is reduced may also be adopted in view of the milling time. In addition, in the case where the method is adopted wherein the end point of opening a window is judged on the basis of the time point when detecting the second peak P2 corresponding to the underlying tungsten layer 17*b*, the overlying tungsten layer 17*b* is not necessarily required, and hence the similar judgement of the milling end point to that described above can be carried out even only on the basis of the provision of the underlying tungsten layer 17*b*.

While the milling end point is judged in such a way, the magnitude of the MCP signal may be changed in some cases due to the setting of the MCP voltage on the focused ion beam milling system side, or the change in the situation such as degradation of the MCP itself and the like. If the magnitude is changed, then the threshold level for judging a peak deviates from the original setting situation, which results in the maljudgement occurring. Then, in the present embodiment, the method is adopted, where in the value of the threshold level i s adjusted on the basis of the magnitude of the MCP signal in the judgement start dose, in order to correct the fluctuation on the focused ion beam milling system side. For example, the ratio R of the magnitude of the MCP signal in the judgement start dose to the predetermined magnitude of the reference signal, and the value which is obtained by multiplying the predetermined reference threshold level by that ratio is adopted as the correction threshold level.

In addition, while in the present circumstances, the correction can be carried out without any trouble on the basis of the above-mentioned method, in actual, since the magnitude of the MCP signal is changed by adjusting both contrast and brightness, in order to carry out the more accurate adjustment, both contrast and brightness need to be taken into consideration. In order to attain this, it is preferable to utilize the change in the magnitude of the signal corresponding to the silicon nitride layer 18 in the LSI which change is mainly used in the milling in the present embodiment. More specifically, in FIG. 10, the ratio R of the peak level Po to the bottom level B2 in the magnitude of the MCP signal when the milling progresses from the overlying silicon dioxide layer 15 to the underlying silicon dioxide layer 15 through the silicon nitride layer 18 is obtained, and the value which is obtained by dividing that ratio R by the predetermined standard ratio is multiplied by the standard threshold level, and the resultant value is set as the optimal threshold level.

With respect to the change in the magnitude of the MCP signal in those layers, since the depth from the surface is fixed and also each of the silicon dioxide layer 15 and the silicon nitride layer 18 is more uniform than metal having the crystal grain as a wiring material, the highly reliable signal change is obtained at all times and hence it is optimal for the standard milling.

Incidentally, in the case where the focusing state of the beam is not excellent, the change in the magnitude of the MCP signal becomes gentle. Therefore, for the threshold level which is corrected on the basis of the above-mentioned method, the influence by the beam focusing state is also suitably corrected. In addition, the method may also be adopted wherein an area having the layer structure showing the clean secondary ion signal change is provided in the area other than the wiring layer on an LSI as an object of the milling, and the above-mentioned processing of correcting the threshold level is carried out on that area.

If in the actual milling, the parameters such as the judgement start dose in the detection of the milling end point, and the like are made fixed, then the operationalization of the system itself is improved. Therefore, it is preferable that the milling is set to two stages or more, and in the final stage, the judgement of the milling end point is carried out on the basis of the fixed conditions (e.g., the milling is made progress to a level which is shallower than that of the wiring layer as an object of the milling by 1 $\mu$m).

The fact that the secondary ion yield of aluminium is low is as described above. Therefore, in the case where the aluminium wiring 16a is formed in the most upper layer as shown in FIG. 16, when the milling is made progress to the aluminium (tungsten) wiring 17 as the wiring layer of an object of the milling in one stage, the peaks P1 and P2 of the aluminium (tungsten) wiring 17 do not appear as shown in FIG. 17. This reason is that aluminium 16 deposited to the side wall of the milled hole 21 is always struck down to the milled bottom face to cancel the high secondary ion yield of tungsten.

Then, as shown in FIG. 18, firstly, the first stage milling is carried out to the depth D1 so as to mill up the aluminium wiring 16a. At this time, as shown in FIG. 19, the magnitude of the secondary ion signal is greatly decreased in the aluminium layer 16a. Thereafter, when carrying out the second stage milling under the condition in which the scanning area of the ion beam is reduced to scale down the milling size to reduce the application of the ion beam to the side wall of the milled hole 21, as shown in FIG. 20, the peaks P1 and P2 corresponding to the two tungsten wiring layers 17a and 17b can be detected. Incidentally, the bottom B between the two peaks corresponds to the aluminium wiring layer 16b.

In such a way, in the case where the layer (in this example, the aluminium wiring layer 16a) made of a material having a low secondary ion yield is formed above the wiring layer (in this example, the wiring layer 17) as an object of the milling, the first stage milling is carried out to the depth D1 with the larger size than the milling size for the objective wiring layer 17 so as to mill up the first stage wiring layer, and then the second stage milling is carried out with the predetermined scaled down size, whereby it is possible to obtain the secondary ion signal required for detecting the milling end point. This method is effective in many cases.

Incidentally, while in the above-mentioned embodiments, since the ion beam irradiation is optimal for the detection of the milling end point in an LSI, which is mainly milled in the present invention, because the charge-up can be avoided and also the secondary ion yield is excellent, the description has been given mainly with respect to the specific case where the ion beam is applied in order to detect the secondary ions, the present invention is not limited thereto. That is, in the case where the surface to be milled can be coated with a conductive layer as well as in the case of a milling object in which the charge-up is less and also no movement of the beam irradiation point occurs, the secondary electron by which a larger number of particles can be detected can be utilized for the detection of the milling end point as long as it has the function equal to that of the secondary ion.

As set forth hereinabove, according to the present invention, for a wiring layer including a tungsten layer which is currently in the process of becoming the main current, the milling end point can be clearly judged in the focused ion beam milling. In addition, since the judgement of the milling end point can be automated, a burden imposed on an operator can be reduced and also the difference in the judgement of the milling end point between operators is removed, and hence the milling can always be carried out to the desired depth. In addition, since the interval between the judgement of the milling end point can be shortened, the milling can be prevented from progressing excessively. As a result, the milling yield in the focused ion beam milling can be enhanced.

While the present invention has been particularly shown and described with reference to the preferred embodiments and the specified modifications thereof, it will be understood that the various changes and other modifications will occur to those skilled in the art without departing from the scope and true spirit of the invention. The scope of the invention is therefore to be determined solely by the appended claims.

We claim:

1. A method for judging a milling end point for use in a charged particle beam milling system of applying and scanning a charged particle beam to a predetermined area to be milled in an electronic device including a multi-wiring layer structure, in which an insulating layer and a wiring layer are laminated, to detect a milling end point, thereby carrying out the milling to a predetermined depth, said method comprising the steps of:

detecting secondary charged particles which are emitted from an irradiated area through the irradiation of the charged particle beam and providing detected signals indicative thereof;

monitoring a change in the detected signals;

detecting either a peak of the detected signals in the layer made of a construction material having a high secondary charged particle yield, or a bottom of the detected signals in the layer made of a construction material having a low secondary charged particle yield; and judging the desired milling end point on the basis of the detected peak or bottom.

2. A method according to claim 1, wherein said monitoring step is to accumulate the detected signals in said detection step every field of said milling area so as to monitor the direction of the change in a value which is obtained by the accumulation.

3. A method according to claim 1, wherein said monitoring step is to accumulate and equalize the detected signals in said detection step every field of said milling area so as to monitor the direction of the change in the accumulated and equalized signal.

4. A method according to claim 1, wherein said monitoring step is to accumulate and equalize the detected signals in said detection step every field of said milling area and to differentiate the accumulated and equalized signal so as to monitor the direction of the change in the detected signal.

5. A method according to claim 4, wherein said step of detecting either the peak or bottom is carried out by detecting the change in a sign of the differential signal which has been obtained by the differential calculus.

6. A method according to one of claims 1 to 5, wherein said step of detecting either the peak or bottom is carried out by judging that a level of the signal which is finally obtained in said monitoring step exceeds a predetermined threshold level.

7. A method according to claim 1, wherein said step of detecting the secondary charged particles is to detect the secondary charged particles emitted from an area which is smaller than the area irradiated with the charged particle beam in the area in milling.

8. A method according to claim 1, wherein said monitoring step is to detect the peak of the detected signals generated due to the irregularity of the bottom face in milling, thereby enhancing the accuracy of judgement of the milling end point.

9. A method according to claim 6, wherein the threshold level is set on the basis of the magnitude of the detected signal in said step of detecting the secondary charged particles in the end point judgement start dose.

10. A method according to claim 6, wherein the threshold level is set on the basis of the change in the magnitude of the detected signal of the secondary charged particles which are detected when milling the layer, in which the change in the detected signal corresponding to the emitted secondary charged particles is previously known, after starting the judgement of the milling end point.

11. A method according to claim 1, wherein the milling is carried out in a plurality of stages, and the judgement of the milling end point is carried out in the final stage of the plurality of stages.

12. A method according to claim 11, wherein the milling in the final stage in which the judgement of the milling end point is carried out is carried out in a milling area which includes a milling area in the stage before the final stage and which is smaller than the milling area in said stage before the final stage.

13. A method according to claim 6, wherein the milling is carried out in a plurality of stages, and the judgement of the milling end point is carried out in the final stage of the plurality of stages.

14. A method according to claims 13, wherein said step of detecting either the peak or bottom is carried out by judging that a level of the signal which is finally obtained in said monitoring step exceeds a predetermined threshold level.

15. A method according to claim 14, wherein the threshold level is set on the basis of the magnitude of the detected signal in said step of detecting the secondary charged particles in the end point judgement start dose.

16. A method according to claim 1, wherein a layer structure in which the change in the secondary charged particle signal is known is previously formed in said electronic device, and after completion of the milling for said layer structure, the milling for said area to be milled is carried out to judge the milling end point.

17. A milling end point judging system for use in a charged particle beam milling system for applying and scanning a charged particle beam to a predetermined area to be milled in an electronic device including a multi-wiring layer structure, in which an insulating layer and a wiring layer are laminated, to detect a milling end point, thereby carrying out the milling to a predetermined depth, said system comprising:

a secondary particle detector for detecting secondary charged particles which are emitted from an irradiated area through the irradiation of the charged particle beam and providing detected signals indicative thereof;

means for monitoring a change in the detected signals which are detected by said detector;

means for detecting either a peak of the detected signals in the layer made of a construction material having a high secondary charged particle yield, or a bottom of the detected signals in the layer made of a construction material having a low secondary charged particle yield; and means for judging the desired milling end point on the basis of the detected peak or bottom.

18. A system according to claim 17, wherein the charged particle beam is an ion beam.

19. A system according to claim 17, wherein said electronic device is either an LSI or a liquid crystal display panel.

20. A system according to claim 17, wherein said wiring is constructed in the form of a lamination structure in which a layer having a higher secondary charged particle yield than that of said insulating layer and a layer having a lower secondary charged particle yield than that of said insulating layer are laminated.

21. A system according to claim 20, wherein said construction material layer having a higher secondary ion yield than that of said insulating layer is made of at least one kind of metal which is selected from the group consisting of tungsten, tungsten alloy, molybdenum, molybdenum alloy, titanium, titanium alloy, tantalum and tantalum alloy.

22. A system according to claim 20, wherein said construction material layer having a lower secondary ion yield than that of said insulating layer is made of at least one kind of material which is selected from the group consisting of aluminium, aluminium alloy and polycrystalline silicon.

23. A milling end point judging system for use in a charged particle beam milling system for condensing a charged particle beam drawn from a charged particle source on a sample to be milled in order to apply and scan the charged particle beam onto said sample, thereby milling a predetermined area of said sample to a predetermined depth, said system comprising:

a secondary particle detector for detecting secondary charged particles which are emitted from the irradiated area through the irradiation of the charged particle beam and providing detected signals indicative thereof;

a circuit for transmitting the detected signals, which have been detected by said detector, to a controller for controlling said charged particle beam milling system, and also for transmitting the detected signals to a module for milling end point judgement different from said controller, wherein said module for milling end point judgement carries out the judgement for a milling end point independently of said controller.

24. A system according to claim 23, wherein said charged particle source is an ion source.

25. A system according to claim 23, wherein said charged particle beam milling system is a focused ion beam milling system.

26. A system according to claim 23, wherein said secondary charged particle detector is a secondary electron detector.

27. A system according to claim 23, wherein said secondary charged particle detector is a secondary ion detector.

28. A system according to claim 23, further comprising an accumulation circuit for accumulating the detected signals, which have been detected by said secondary charged particle detector, whenever scanning one field with the charged particle beam so as to latch the resultant data, wherein said module for milling end point judgement reads out the data, which has been latched in said accumulation circuit, at predetermined intervals in order to utilize the data thus read out for judgement of a milling end point.

29. A system according to claim 23, wherein said module for milling end point judgement comprises:

means for detecting either a peak of the detected signals in a layer made of a construction material having a high secondary charged particle yield, or a bottom of the detected signals in a layer made of a construction material having a low secondary charged particle yield; and means for judging a desired milling end point on the basis of the detected peak or bottom.

30. A method for judging a milling end point for use in a charged particle beam milling system of applying and scanning a charged particle beam to a predetermined area to be milled in an electronic device including a multi-wiring layer structure, in which an insulating layer and a wiring layer are laminated, to detect a milling end point, thereby carrying out the milling to a predetermined depth, said method comprising the steps of:

detecting secondary charged particles which are emitted from an irradiated area through the irradiation of the charged particle beam and providing detected signals indicative thereof;

wherein said step of detecting the secondary charged particles is to detect the secondary charged particles emitted from an area which is smaller than the area irradiated with the charged particle beam in the area in milling;

monitoring a change in the detected signals of the secondary charged particles emitted from an area which is inside and smaller than the irradiated area for milling; and judging the milling end point from the monitored change in the detected signals.

31. A method according to claim 30, wherein said judging step is carried out at intervals of 0.1 second or less.

32. A method according to claim 30, wherein said judging step is carried out after a predetermined amount of the charged particle beam is irradiated.

33. A method of judging a milling end point in an ion beam milling system, comprising the steps of:

irradiating a focused ion beam on a surface of a specimen which has at least a thin film layer formed on a substrate and milling the surface of the specimen;

detecting a secondary ion emitted from the specimen;

monitoring a change of a signal of the detected secondary ion; and judging the milling end point from the monitored change of the signal by comparing it to a threshold level;

wherein the threshold level varies on the basis of the intensity of the signal.

34. A method according to claim 33, wherein said monitoring step monitors a change of the signal of the detected secondary ion emitted from an area which is inside the irradiated area for milling.

35. A method according to claim 33, further comprising a step of stopping the irradiation of the focused ion beam onto the surface of the specimen according to the judged milling end point.

* * * * *